US012720726B2

(12) United States Patent
Suthram et al.

(10) Patent No.: US 12,720,726 B2
(45) Date of Patent: Aug. 25, 2026

(54) MEMORY STRUCTURE FOR LOW TEMPERATURE OPERATION

(71) Applicant: Intel Corporation, Santa Clara, CA (US)

(72) Inventors: Sagar Suthram, Portland, OR (US); Abhishek Sharma, Portland, OR (US); Wilfred Gomes, Portland, OR (US); Pushkar Ranade, San Jose, CA (US); Kuljit S. Bains, Olympia, WA (US); Tahir Ghani, Portland, OR (US); Anand Murthy, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 92 days.

(21) Appl. No.: 17/943,038

(22) Filed: Sep. 12, 2022

(65) Prior Publication Data

US 2023/0005921 A1 Jan. 5, 2023

(51) Int. Cl.
*H10B 12/00* (2023.01)
*G11C 5/06* (2006.01)

(52) U.S. Cl.
CPC ........... *H10B 12/312* (2023.02); *G11C 5/063* (2013.01)

(58) Field of Classification Search
CPC ...................... H10B 12/30; H01L 2225/06589
See application file for complete search history.

(56) References Cited

U.S. PATENT DOCUMENTS 11,043,472 B1 6/2021 Dokania et al.
2006/0063314 A1* 3/2006 Hokazono .............. H10P 30/20 257/E21.334
2008/0308870 A1* 12/2008 Faul ....................... H10D 30/60 257/E29.226
2012/0181651 A1* 7/2012 Jiang ...................... H10N 50/10 257/467
2020/0402569 A1 12/2020 He et al.
2021/0366819 A1* 11/2021 Chiang ............... H10W 40/305
2022/0415742 A1* 12/2022 Sahu ..................... H10W 40/10
2023/0135869 A1 5/2023 Yen
2023/0290831 A1* 9/2023 Sharma .................. H10D 64/01

(Continued)

FOREIGN PATENT DOCUMENTS

JP 2020074093 A * 5/2020 ........... G06F 3/0412
WO WO-2020107170 A1 * 6/2020 ............. H10K 50/14

OTHER PUBLICATIONS

"How to achieve the threshold voltage thermal coefficient of the MOSFET acting on design parameters", AN2386 Application note, Jun. 2006, 30 pages.

(Continued)

*Primary Examiner* — Edward Chin
(74) *Attorney, Agent, or Firm* — Compass IP Law PC

(57) ABSTRACT

A system can be designed with memory to operate in a low temperature environment. The low temperature memory can be customized for low temperature operation, having a gate stack to adjust a work function of the memory cell transistors to reduce the threshold voltage (Vth) relative to a standard memory device. The reduced temperature can improve the conductivity of other components within the memory, enabling increased memory array sizes, fewer vertical ground channels for stacked devices, and reduced operating power.

21 Claims, 8 Drawing Sheets

(56) References Cited

U.S. PATENT DOCUMENTS

2023/0317557 A1* 10/2023 Sharma ................ H10W 40/47 257/714
2024/0023314 A1 1/2024 Lu et al.

OTHER PUBLICATIONS

Kalra, Shruti, et al., "An Analytical Study Of Temperature Dependence of Scaled CMOS Digital Circuits Using α-Power MOSFET Model", Journal of Integrated Circuits and Systems 2016; v.11, 12 pages.
Neshatpour Katayoun, et al., "Revisiting Dynamic Thermal Management Exploiting Inverse Thermal Dependence", 2015 ACM, Mar. 14, 2015, 6 pages.
Pratap, Dr. Rajendra, et al., "Effect of Temperature Inversion on Lower Nodes", Home/Technology/Analog & Power/Power Semiconductors & Wireless Charging, Oct. 28, 2020 4 pages.
U.S. Appl. No. 17/943,044, filed Sep. 12, 2022, 63 pages.
Zu, Yazhou, et al., "Ti-states: Processor Power Management in the Temperature Inversion Region", 2016 IEEE, Aug. 15, 2016, 13 pages.
First Office Action for U.S. Appl. No. 17/943,044, Mailed Oct. 24, 2025, 17 pages.

* cited by examiner

MEMORY STRUCTURE FOR LOW TEMPERATURE OPERATION

RELATED APPLICATIONS

This application is related to U.S. application Ser. No. 17/943,044, entitled "SYSTEM DESIGN FOR LOW TEMPERATURE MEMORY," filed concurrently herewith.

FIELD

Descriptions are generally related to memory subsystems, and more particular descriptions are related to memory device structure.

BACKGROUND

As the scale of computing increases, the number of operations executed per second grows with it. Increasing compute drives ever higher memory performance needs which directly puts stress on memory bandwidth and power. Since the power budget for a memory subsystem remains roughly constant there is constant pressure to reduce memory power at matched or better performance.

Memory may have an operating temperature of approximately 85-100 C, which is actively managed by the memory controller in the compute unit. Increased access by the compute unit to the memory increases the memory temperature as the memory draws more power. A system can cool the system to reduce the amount of heat generated by the increased memory operation and eventually throttle its performance when it hits its max temperature limit as specified by the memory vendor.

While cooling may be important for removing heat from the system, low temperature cooling (e.g., below 25 C) can have a negative performance impact on memory, which includes integrated transistor devices. The transistor performance can be described by its drain current, which is (in the active/saturation region):

$$Id = \frac{\mu(T) * Cox}{2} * \frac{W}{L} * (Vgs - Vth(T))^2 \quad (1)$$

where Id is the transistor drain current, μ(T) is the carrier mobility which depends on the temperature, T, Cox is the dielectric capacitance, W is the channel width, L is the channel length, Vgs is the gate to source voltage, and Vth(T) is the threshold voltage which depends on temperature.

Operating temperature increases will decrease the threshold voltage, which increases drain current. Even though increased temperature will decrease carrier mobility, the voltage threshold term will dominate for devices where the operating voltage is close to the threshold voltage. This inverted (or inverse) temperature dependence (ITD) causes increased drain current for memory devices at higher temperature.

When cooling decreases the temperatures below ambient temperature, especially when very low temperature cooling is used, the threshold voltage increases, reducing the drain current. Thus, lowering the temperature of a traditional computing system to address the heat generated by the memory has a negative performance impact on the memory based on the inverse temperature dependence, if no additional process or system modifications to account for it are made.

BRIEF DESCRIPTION OF THE DRAWINGS

The following description includes discussion of figures having illustrations given by way of example of an implementation. The drawings should be understood by way of example, and not by way of limitation. As used herein, references to one or more examples are to be understood as describing a particular feature, structure, or characteristic included in at least one implementation of the invention. Phrases such as "in one example" or "in an alternative example" appearing herein provide examples of implementations of the invention, and do not necessarily all refer to the same implementation. However, they are also not necessarily mutually exclusive.

Descriptions of certain details and implementations follow, including non-limiting descriptions of the figures, which may depict some or all examples, and well as other potential implementations.

DETAILED DESCRIPTION

As described herein, a system can be designed with memory to operate in a low temperature environment. There are emerging exa-scale computing systems. A move to scale computing past exa-scale (e.g., toward zetta-scale computing) can involve low temperature cooling of the memory devices. As mentioned above, the inverse temperature dependence (ITD) inherent in the device physics of transistors can have an inverse performance impact on standard memory devices. Designing the memory devices and the system for low temperature operation not only can compensate for the performance impact of ITD, but it can also enable the use of the low temperature environment to improve memory performance and overall system performance.

The low temperature memory can be customized for low temperature operation, having a gate stack to adjust a work function of the memory cell transistors to reduce the threshold voltage (Vt) relative to a standard memory device. The reduced temperature can improve the conductivity of other components within the memory, enabling increased memory array sizes, fewer vertical ground channels for stacked devices, and reduced operating power. Based on the differences in the memory, the memory controller can manage access to the memory device with adjusted control parameters based on lower leakage current for the memory cells and lower line resistance for the memory array.

Figure 1:
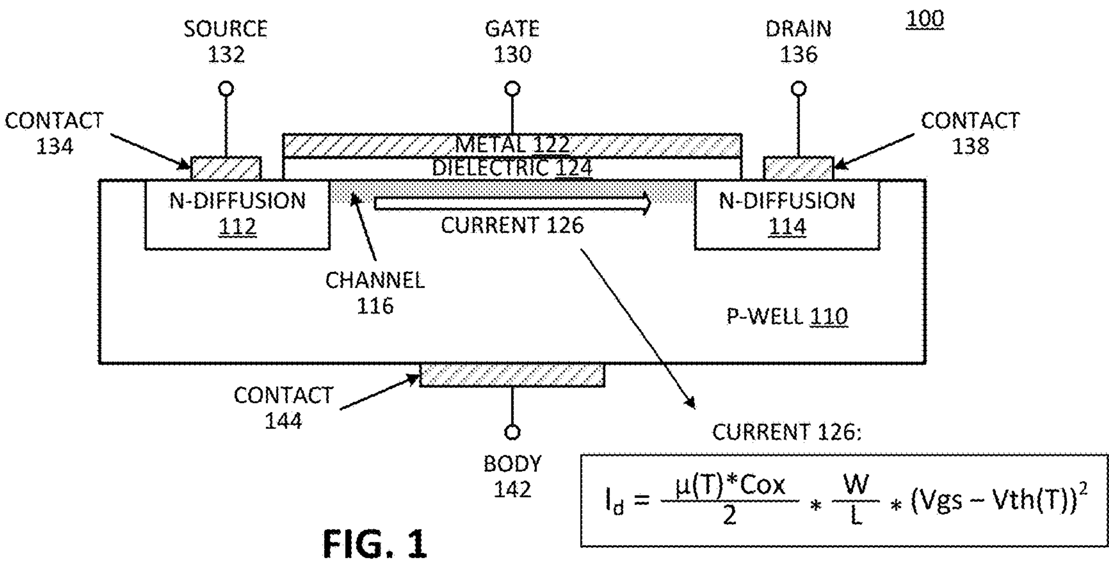
FIG. 1 is a block diagram of an example of a transistor designed for low temperature applications.

FIG. 1 is a block diagram of an example of a transistor designed for low temperature applications. Circuit 100 represents a transistor device. It will be understood that the elements illustrated are not necessarily drawn to scale. Elements of circuit 100 can have multiple layers or portions, where circuit 100 is generally representative of the elements of a transistor.

A p-type transistor can be referred to as a p-type metal-oxide-semiconductor (PMOS) device, and an n-type transistor can be referred to as an n-type metal-oxide-semiconductor (NMOS) device. A p-type transistor (or PMOS) refers to a transistor that has majority holes as the electrical carriers in the induced channel. An n-type transistor (or NMOS) refers to a transistor that has a majority electrons as the electrical carriers in the induced channel.

Circuit 100 includes a substrate, which represents a semiconductor substrate on which the transistor is formed. Circuit 100 can be a p-type transistor or an n-type transistor. For a p-type transistor, the substrate is an n-type material (i.e., a semiconductor doped with an element having a valence band that is nearly empty, having only a small number of electrons in the outer band). For an n-type transistor, the substrate is a p-type material (i.e., a semiconductor doped with an element having a valence band that is nearly full, lacking only a small number of electrons in the outer band). The example illustrated in circuit 100 is an n-type transistor, with a p-well 110 representing the transistor substrate.

N-diffusion 112 represents a region of p-well 110 doped with the opposite carriers (e.g., since the substrate is p-type, the source region is n-doped) as the substrate. Contact 134 is a metal or highly doped polysilicon material that electrically contacts n-diffusion 112. Contact 134 and n-diffusion 112 represent the source of the transistor for circuit 100, as indicated by source 132. However, it will be understood that reversing the voltages described below can reverse the flow of current through circuit 100. Generally, the source and drain are identified by the current flow through the transistor, with current 126 flowing from source to drain.

N-diffusion 114 represents a region of p-well 110 doped with the opposite carriers as the substrate. Contact 138 is a metal or highly doped polysilicon material that electrically contacts n-diffusion 114. Drain 136 is the transistor terminal represented by contact 138 and n-diffusion 114. Channel 116 represents a region of carriers induced in the depletion region (which is not explicitly shown) between n-diffusion 112 and n-diffusion 114. For simplicity, channel 116 is illustrated with uniform depth between n-diffusion 112 and n-diffusion 114, which is an idealization for purposes of discussion.

Circuit 100 can include contact 144 connected to p-well 110. Circuit 100 illustrates contact 144 on the back side of p-well 110. However, contact 144 can be on the back side or on the top side of the substrate. The back side refers to the side of p-well 110 opposite the surface on which the transistor source, drain, and gate are disposed. Contact 144 represents body 142. In one example, p-well 110 is tied to source 132 to avoid body effects. If the body effect is used, body 142 is the control terminal to bias p-well 110.

Circuit 100 includes gate 130, which includes a gate stack. The gate stack refers to metal 122 and dielectric 124, which make up the materials above channel 116. Metal 122 represents the metal, polysilicon, or the combination of metal and polysilicon that make up the composition of the conductive contact for gate 130. The composition of metal 122 can be referred to as the work function of the gate metal or gate conductor.

The composition of the electrode has an impact on how the transistor acts when source 132, drain 136, and gate 130 are biased to induce channel 116. Metal 122 represents the electrode conductor. Seeing that the metal layer work function can be or include doped polysilicon in addition to or instead of metal, metal 122 could alternatively be referred to as a conductor.

Metal 122 is separated from the depletion region of p-well 110 that is between n-diffusion 112 and n-diffusion 114 by dielectric 124. In one example, dielectric 124 is made of oxide, such as a semiconductor oxide formed on the semiconductor of p-well 110. In one example, dielectric 124 is an insulating layer that includes a non-oxide material. Generally, dielectric 124 can be referred to as a high-K material that provides electrical isolation of metal 122 from channel 116, allowing the build up of charge with a voltage potential instead of allowing direct current from metal 122 to channel 116.

When drain 136 and source 132 are biased with Vdd, a voltage differential between drain 136 and source 132, where Vdd>Vth. Gate 130 is biased with Vth, which is a threshold voltage that depends on the gate stack, the dielectric layer, and the temperature of the device. The threshold voltage is the minimum voltage necessary to induce channel 116.

When gate 130, drain 136, and source 132 are biased to cause current 126 to flow, current 126 can be described by Equation (1), which is repeated below:

$$Id = \frac{\mu(T) * Cox}{2} * \frac{W}{L} * (Vgs - Vth(T))^2 \tag{1}$$

where Id is the transistor drain current, μ(T) is the carrier mobility which depends on the temperature, T, Cox is the dielectric capacitance, W is the channel width, L is the channel length, Vgs is the gate to source voltage, and Vth(T) is the threshold voltage which depends on temperature.

A commodity memory device (e.g., a dynamic random access memory (DRAM) device) is designed with transistors to have a threshold voltage (Vth) in a range of approximately 300-500 mV for an operating temperature in a range of approximately 85-100 C. As discussed above, the commodity DRAM will have a negative performance impact when operating at a low temperature, such as below 25 C, and more specifically at a temperature of subzero (<0) C. Thus, commodity in-package DRAMs and commodity high-bandwidth memory (HBM) having standard transistor designs will experience performance degradation when operated at very low temperatures.

Circuit 100 can represent a transistor for use in a memory device having a low operating temperature. Circuit 100 can be designed to operate at a temperature within a range of approximately −25 C to +25 C. In one example, circuit 100 is designed for operation at a temperature below 0 C. At lower temperatures, the temperature dependence of Vth and μ can impact the drain current.

In one example, circuit 100 has a gate stack that is modified to provide a threshold voltage of approximately equal to the standard device, but for a lower operating temperature. In one example, circuit 100 has a gate stack that is modified to provide a threshold voltage of having a range of approximately 50-150 mV lower as compared to standard device, and that operates at the lower operating temperature.

In one example, circuit 100 has a different gate stack profile as compared to a standard transistor for a commodity DRAM. In one example, dielectric 124 represents a high-K dielectric between metal of the gate stack and the transistor channel, which can be controlled for thickness to adjust the work function of the gate stack to reduce the Vth by approximately 50-150 mV for as compared to the standard device. In one example, dielectric 124 represents an oxide layer controlled for thickness to adjust the work function of the gate stack to reduce the Vth by approximately 50-150 mV for as compared to the standard device. In one example, metal 122 represents a conductor (e.g., metal, poly) controlled for thickness to adjust the work function of the gate stack to reduce the Vth by approximately 50-150 mV for as compared to the standard device. In one example, metal 122 represents a metal gate with a composition controlled to adjust the work function of the gate stack to reduce the Vth by approximately 50-150 mV for as compared to the standard device. Thus, the metal gate thickness and the metal gate composition can be controlled for a custom memory device.

Circuit 100 does not specifically illustrate the control circuitry, such as drivers or decoder circuitry, that will apply the voltage bias to gate 130. Such a control circuit can provide a bias voltage at the same level (same value) as the standard device, which will cause a higher overdrive relative to the standard device, causing more current to flow. The control circuit can provide a bias voltage having a lower level (lower value) as compared to the standard device, which will cause the same overdrive as the standard device while using less power.

Circuit 100 specifically represents a planar transistor device, where the gate is placed above a plane having regions for the source and drain. Similar design techniques can be applied to a finFET (fin-shaped field effect transistor) or a gate all around (GAA) transistor. A finFET refers to a transistor that has a region of material extending up from the substrate, where the gate material surrounds the material in the channel region on three sides. A GAA transistor refers to a transistor having a material (essentially a semiconductor wire) that has a channel portion that passes through the gate material, where the gate surrounds the channel region on all four sides.

It will be understood that with the three-dimensional (3D) structure of a finFET and a GAA transistor, the control of the metal and dielectric layers for a low temperature finFET or a low temperature GAA transistor could be different from the low temperature planar transistor. The control of the metal and dielectric layers can be different for a low temperature finFET transistor than for a low temperature GAA transistor. The gate stack layers for each different transistor type can be controlled differently to achieve a similar capability to operate within the low temperature environment referred to above. Each different device type can be designed with the gate stack to achieve a threshold voltage lower than what would be provided by a standard device, an unmodified device, at the low operating temperatures.

Figure 2:
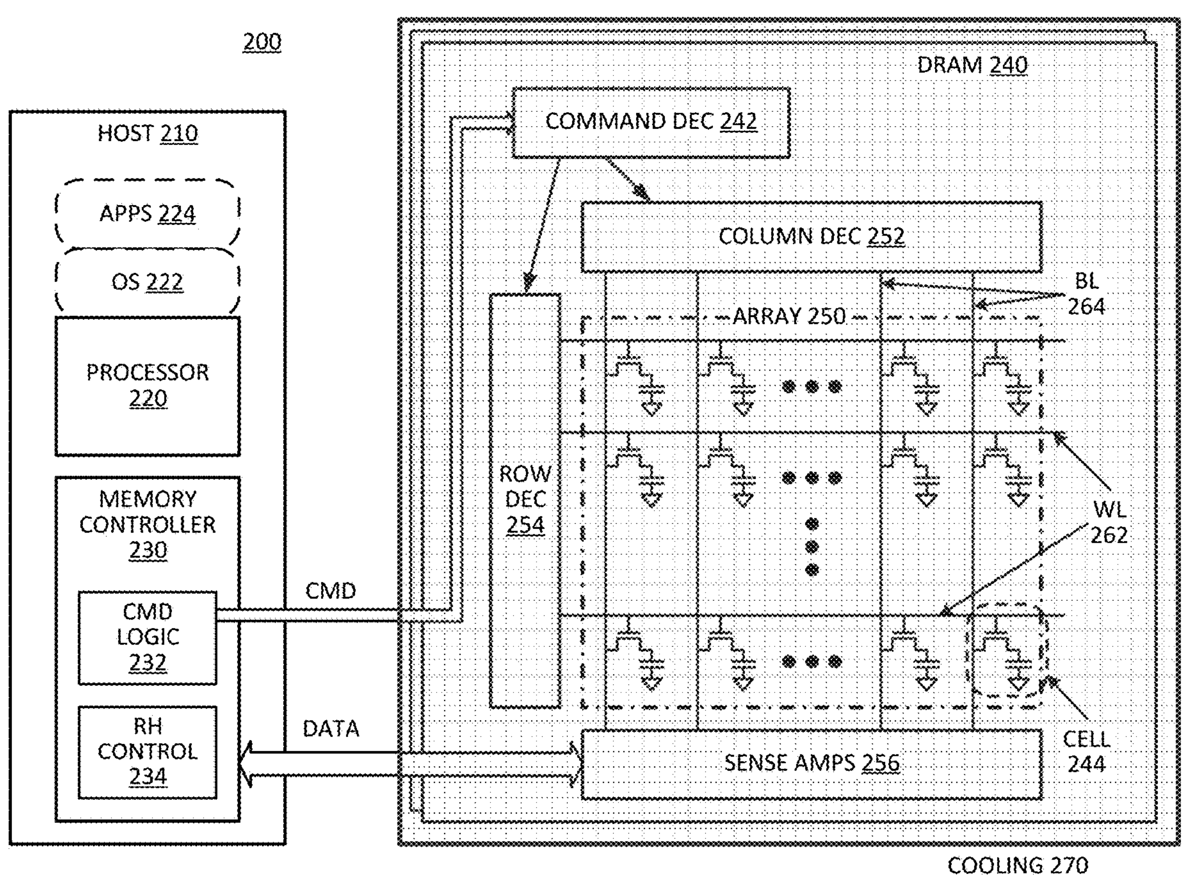
FIG. 2 is a block diagram of an example of a memory array with low temperature transistors.

FIG. 2 is a block diagram of an example of a memory array with low temperature transistors. System 200 provides an example of a DRAM die having transistor in accordance with an example of circuit 100. In system 200, the memory is specifically illustrated as a DRAM (dynamic random access memory) device. DRAM 240 represents one of multiple DRAM devices that can be coupled to host 210.

Host 210 represents a hardware platform for system 200, with processor 220 and memory controller 230. Processor 220 can be referred to as a host processor. Processor 220 executes OS (operating system) 222, and OS 222 provides a software platform for system 200, on which other applications and processes will execute on the hardware platform of host 210. Applications (APPS) 224 represent other applications or services in system 200. The execution of OS 222 and applications 224 generate access requests for DRAM 240.

Memory controller 230 manages access to DRAM 240. In one example, memory controller 230 includes command (CMD) logic 232 to generate access commands to send to DRAM 240. The command is represented as CMD over a command bus to DRAM 240. The command can be any type of command. In one example, memory controller 230 includes row hammer (RH) control 234, which represents circuitry or logic at memory controller 230 to manage row hammer conditions at DRAM 240.

System 200 also illustrates a data bus, represented as DATA, coupling memory controller 230 to DRAM 240 to exchange data. The command bus is a unilateral bus, and the data bus is a bidirectional bus.

DRAM 240 includes memory array 250 with multiple memory cells 244. Memory cells 244 can include a transistor in accordance with an example of circuit 100 and a capacitor, which is a storage region of memory array 250. Memory cells 244 connects to a wordline (WL) 262 and a bitline (BL) 264, with the specific WL/BL location representing an address identifiable by a combination of row (WL) and column (BL) address, which may also require a bank and bank group address to specify a portion of the array to access.

DRAM 240 includes command decoder (DEC) 242 to receive and decode commands on the command bus. Command decoder 242 generates one or more internal operations based on commands received from memory controller 230.

Row decoder (DEC) 254 represents decoding hardware to select rows or wordlines for read, write, or other access. Column decoder (DEC) 252 represents decoding hardware to select columns or bitlines. Sense amps (amplifiers) 256 represent sense amplifiers to stage data for access to array 250. For a write, write data is written into sense amps 256 and then into array 250. For a read, data is read from array 250 into sense amps 256, to return to memory controller 230 over the data bus. The decoding circuitry can represent control circuitry that selectively drives voltage on an access line to bias the memory cell.

In one example, not just the transistors of array 250, but the transistors of decoder and control circuitry are also in accordance with an example of circuit 100. Thus, not only do the transistors of array 250 have a design specific to low temperature operation, but the other circuitry in DRAM 240 can be designed for low temperature operation. Thus, the entire device can be designed for low temperature operation.

The overlay over DRAM 240 represents cooling 270. Cooling 270 provides cooling for DRAM 240. In one example, cooling 270 is limited to cooling the memory. In one example, cooling 270 cools processor 220 in addition to the memory. Cooling 270 can represent ultra-low temperature cooling, such as sub 0 C cooling.

With low temperature operation, signal lines, such as wires, traces, or other carriers of control signals, data signals, and power, with have lower impedance (resistive-capacitive (RC) impedance). With lower impedance on the signal lines, array 250 can be larger by approximately 10-20% relative to standard memory devices. The array can be larger without drawing additional power and without affecting the communication speed (no degradation in timing) because of the lower RC values. In one example, the RC values can be reduced by approximately 25% relative to a standard device. With lower RC values, for the same power, memory controller 230 can access a larger array 250. Additionally, with the same timing, memory controller 230 can provide commands and receive data from a larger array. In one example, DRAM 240 supports a larger bit access for the reasons stated above.

In one example, DRAM 240 represents a stacked die device. The stacked die device, such as an HBM, has multiple dies in a vertical stack connected with through-silicon vias (TSVs). DRAM 240 designed for lower temperature enables the use of fewer power TSVs because of the lower impedance in the power path. The number of power TSVs can be approximately 10-20% lower than a standard stacked device.

In one example, the low temperature enables array 250 to have a higher bit density relative to a standard device. The low temperature memory cell 244 can provide improved short channel control, enabling the higher bit density. The increased bit density allows more memory cells 244, having a larger array.

In one example, row hammer control 234 of memory controller 230 enables memory controller 230 to manage row hammer for DRAM 240. In one example, memory cells 244 have a lower leakage as compared to standard devices. The lower leakage allows the device to retain a determinate state for longer. Thus, DRAM 240 can have a longer refresh time. More specifically, the time between row refresh cycles (tRFC) and the time for maximum average periodic refresh (tREFI) can be longer as compared to standard devices.

With longer refresh times, when memory controller 230 determines the timing to use to schedule refresh times, the memory controller can schedule refresh times farther apart as compared to standard devices. In one example, the refresh time is not completely controlled by the device physics. Rather than being completely determined by how long the memory device can retain charge due to lower leakage, the system can account for row hammer conditions.

Row hammer refers to a condition in which repeated access to a target row or target wordline can cause unintentional programming of a victim row, which is a row physically adjacent the target row. Depending on device physics, the victim row does not need to be directly adjacent to the target row. Row hammer conditions can be resolved by refreshing the victim rows. The need to refresh the victim rows can end up refreshing rows more frequently than the tRFC and tREFI parameters would dictate. Thus, in general the rows can be refreshed less frequently, but the system can refresh the rows when a row hammer condition is detected, refreshing the rows more often than the time than would be supported by memory cells 244.

Figure 3:
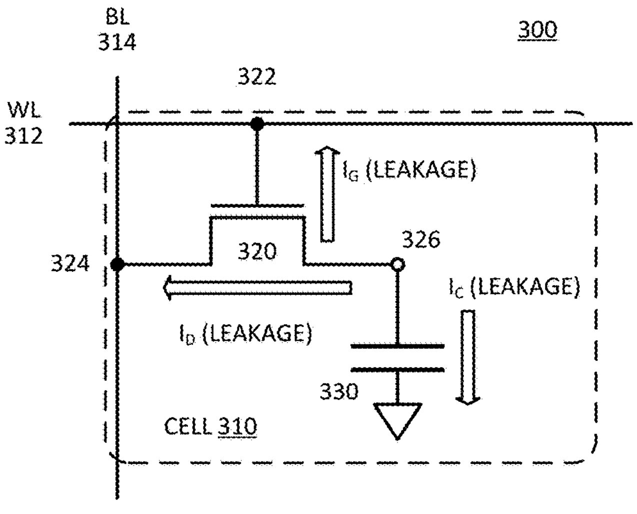
FIG. 3 is a block diagram of an example of a memory cell with components designed for low temperature applications.

FIG. 3 is a block diagram of an example of a memory cell with components designed for low temperature applications. Circuit 300 represents an example of a memory cell. Cell 310 can be a memory cell in accordance with an example of circuit 100 or an example of memory cell 244.

Circuit 300 illustrates wordline (WL) 312 and bitline (BL) 314. Cell 310 includes transistor 320 with a drain connected to BL 314 at node 324 and a gate connected to WL 312 at node 322. WL 312 can be an access line to drive a bias voltage for cell 310. BL 314 can be an access line to drive a bias voltage for cell 310.

In one example, cell 310 includes capacitor 330 connected to the source of transistor 320 at node 326. In one example, cell 310 is a single transistor, single capacitor (1T, 1C) memory cell. In one example, cell 310 can have more components. In one example, cell 310 has multiple transistors and no capacitor.

Circuit 300 illustrates the leakage currents of cell 310. The $I_D$ leakage is the drain current leakage. The $I_G$ leakage is the gate current leakage. The $I_C$ leakage is the capacitor leakage. With the reduced thermal energy, the leakage currents are lower. The drain current leakage and the gate current leakage will be lower for transistor 320 as discussed above.

The device physics of capacitor 330 will also be impacted by the lower operating temperature. The lower operating temperature will also result in lower thermal energy in capacitor 330, reducing the capacitor leakage current. Lower leakages in the bit array as well as at the macro level, by lower leakage through the control circuitry can provide refresh power reduction within the bounds of not degrading memory performance based on rowhammer conditions.

Circuit 300 can be part of a system that operates at a lower Vdd (alternatively, VDD), referring to a high voltage reference, relative to the standard system and standard devices. In one example, the lower overall leakage, lower Vdd, and lower interconnect resistance at sub 0 C temperatures can allow for improved system level power delivery, system level signal routing, and overall memory controller and physical interface (PHY) design. The memory controller design can be adjusted to control for timing of signaling and refreshing the memory device. The PHY design can be adjusted for signaling and physical interfacing based on the lower leakage and lower impedances.

A commodity memory device (e.g., a dynamic random access memory (DRAM) device) is designed with transistors to have a threshold voltage (Vth) in a range of approximately 300-500 mV for an operating temperature in a range of approximately 85-100 C. As discussed above, the commodity DRAM will have a negative performance impact when operating at a low temperature, such as below 25 C, and more specifically at a temperature of subzero (<0) C. Thus, commodity in-package DRAMs and commodity high-bandwidth memory (HBM) having standard transistor designs will experience performance degradation when operated at very low temperatures.

Circuit 300 can represent a memory device with transistors and components having a low operating temperature. Cell 310 can be a custom DRAM. The custom DRAM can have a custom work function targeting low temperature operation to compensate for ITD. The custom DRAM can be fabricated to compensate for the low-temperature operation, which can even turn the low operating temperature into an advantage. In one example, in addition to the custom work function for the device level advantages, with lower leakage and improved carrier mobility at low temperature, the system level can have longer refresh times and larger arrays.

With such features, the effective Vdd of operation of the entire DRAM, referring to the memory cells as well as access transistors in the bit arrays and logic devices in the decoders, sense amps, and peripheral areas, can be reduced by approximately 50-200 mV. The lower Vdd, can provide approximately 3× to 4× power reduction.

Figure 4:
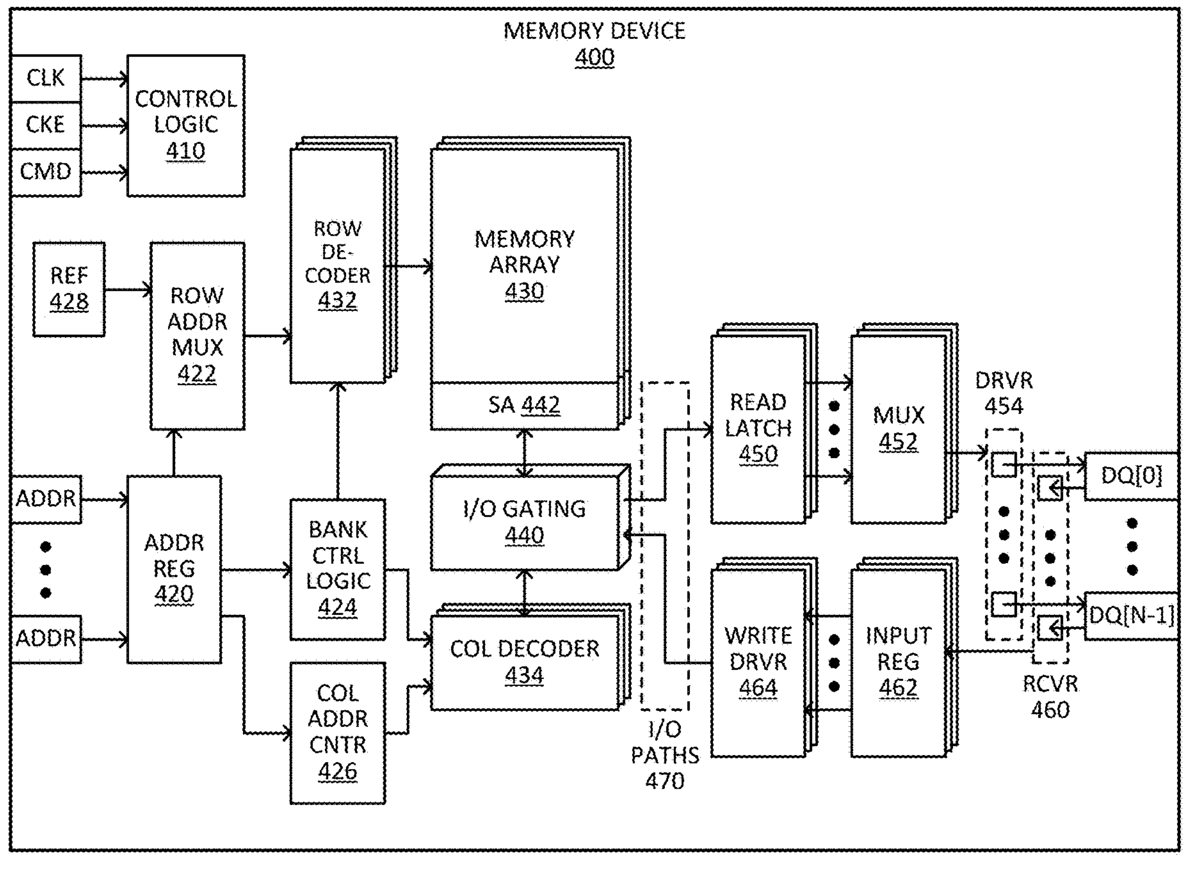
FIG. 4 is a block diagram of an example of a memory device for low temperature applications.

FIG. 4 is a block diagram of an example of a memory device for low temperature applications. Memory device 400 represents one example of a memory device in accordance with any example herein. Row decoder 432 and column decoder 434 can be decoders to selectively bias cells within memory array 430.

Control logic 410 receives clock (CLK), clock enable (CKE), and command signals (CMD), and controls the operation of memory device 400 in relation to those signals. Address register 420 receives row address and bank address signals to identify the portion of memory that is to be affected by a particular command. The address, clock, clock enable, and command signals represent I/O connectors for command and address for memory device 400.

In one example, address register 420 distributes the address information to row address (ADDR) multiplexer (MUX) 422, bank control (CTRL) logic 424, and column (COL) address (ADDR) counter (CNTR) 426. Row address mux 422 takes the row address information and a refresh counter (REF 428) as input, and controls the row address latch (RAL) and decoder (row decoder 432) for each bank of the memory device. Bank control logic 424 selects which bank will be selected for the memory access operation (e.g., based on the command) received. Column address counter 426 generates a signal to select the column for the operation.

Row decoder 432 selects an address in a bank, which includes a row of memory array 430. In one example, memory arrays 430 can be or include subarrays. Signals from bank control logic 424 and column address counter 426 can trigger column decoder (COL DEC) 434 to activate the appropriate sense amplifiers (SA) 442 for the desired memory array 430. Column decoder 434 can trigger I/O gating 440, which represents the hardware including signal lines or wires as well as logic to route data to and from memory arrays 430.

I/O gating 440 can place data into sense amplifiers 442 for a write operation, and can read the data out for a read operation. Column decoder 434 makes a column selection for I/O gating 440 based on bank control logic selection and the column address counter selection. For a read operation, memory device 400 can transfer data from I/O gating 440 to read latch 450. For a write operation, memory device 400 can transfer data from write driver (DRVR) 464 to I/O gating 440.

In one example, read latch 450 is coupled to receive data bits from I/O gating 440 for a read operation. Read latch 450 feeds the data into mux 452, which can select the number of bits corresponding to the device data interface (the N DQ bits illustrated in memory device 400). Mux 452 can send the data to driver 454, which will drive the data on I/O connectors DQ[0:(N−1)]. While not specifically illustrated, it will be understood that driver 454 can drive one or more data strobe lines based on the timing. For a write operation, the controller will provide data on DQ[0:(N−1)]. In one example, receiver 460 receives write data from the data bus, and inputs it into input register or input buffer 462. Input register 462 samples the data in accordance with a data strobe line, and can latch the data to write driver 464, which provides the data to I/O gating 440.

In one example, memory device 400 includes I/O paths 470 to transfer data between I/O gating 440 and the read and write paths. Thus, in one example a data path includes a read path and a write path. I/O paths 470 can be specifically routed to map one or more memory arrays 430 to specific I/O connectors, referring to DQ[0:(N−1)].

In accordance with what is described herein, memory array 430 includes transistors designed for low temperature operation in accordance with any example herein. In addition to the transistors of memory array 430, in one example, the other components of memory device 400 are designed for low temperature operation in accordance with any example herein.

Figure 5:
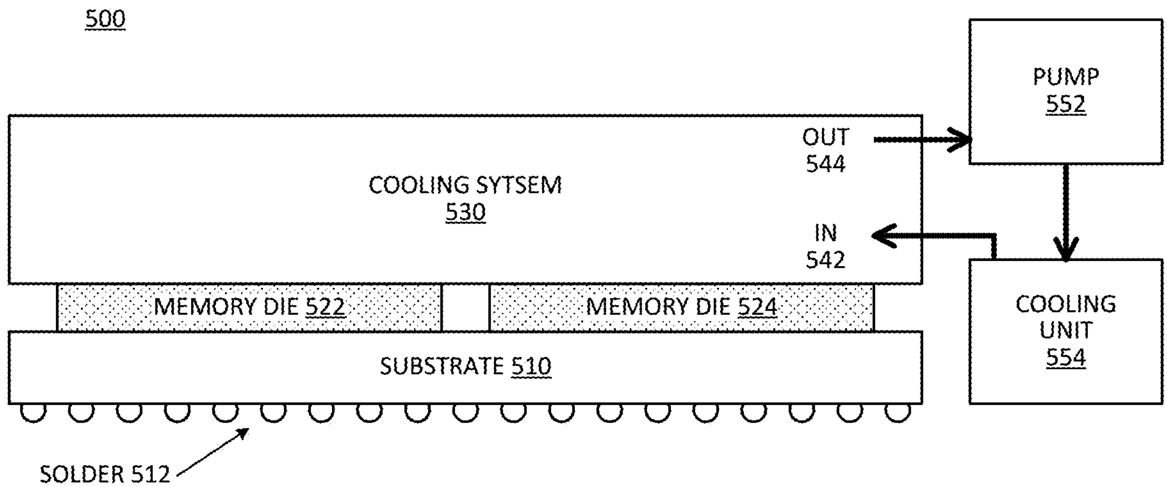
FIG. 5 is a block diagram of an example of a low temperature memory.

FIG. 5 is a block diagram of an example of a low temperature memory. System 500 represents a system in accordance with an example of system 200, with transistors in accordance with an example of circuit 100 or an example of circuit 300.

System 500 includes substrate 510. Substrate 510 optionally includes solder 512. In one example, substrate 510 is a semiconductor substrate that can be mounted into a larger system. In one example, substrate 510 is a system board, which can be a printed circuit board (PCB) such as a system on a chip (SOC) board. Solder 512 represents connections to mount to a system board such as a motherboard. In one example, substrate 510 represents a memory module board. In one example, instead of solder 512, substrate 510 includes conductive contact fingers to interface with a connector.

System 500 includes memory die 522 and memory die 524 mounted on substrate 510. Memory die 522 and memory die 524 represent custom memory dies in accordance with any example of low temperature memory provided. Instead of having degraded performance at low temperature operation, memory die 522 and memory die 524 are designed for low temperature operation, having a gate stack controlled for low temperature operation. In one example, the memory dies are disposed on an SOC board, as integrated memory. In one example, the memory dies are disposed on a dual inline memory module (DIMM).

System 500 includes cooling system 530, which represents a cooling system that can cool system 500 to temperatures in a range of approximately −25 C to +25 C. The memory dies can be designed for operation at such low temperatures, in accordance with any example provided. System 500 illustrates pump 552 or a comparable component to move the fluid used to cool the memory dies of substrate 510. Pump 552 can cause fluid flow toward cooling unit 554, which lowers the fluid to a temperature sufficient to provide a desired operating temperature for the memory dies. In one example, system 500 optionally includes an integrated heat spreader (IHS) between the memory dies and cooling system 530. IN 542 represents an inflow for the cooled liquid to cooling system 530. Cooling system 530 can pass the cooled fluid over memory die 522 and memory die 524, and direct the fluid through OUT 544 to pump 552.

Figure 6:
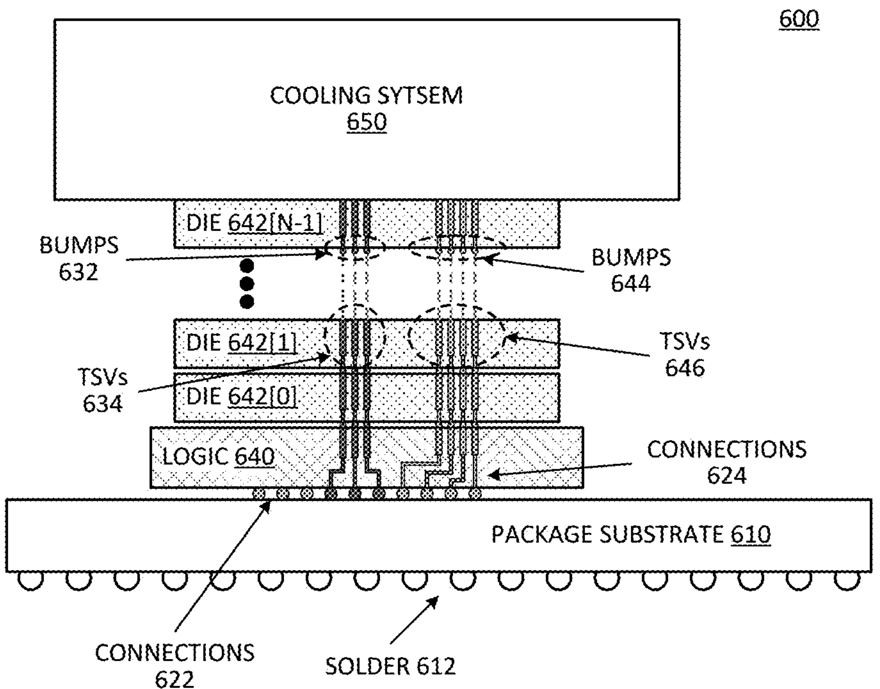
FIG. 6 is a block diagram of an example of a stacked, low temperature memory.

FIG. 6 is a block diagram of an example of a stacked, low temperature memory. System 600 represents a system in accordance with an example of system 200, with transistors in accordance with an example of circuit 100 or an example of circuit 300.

System 600 includes package substrate 610 with solder 612. In one example, package substrate 610 is a semiconductor substrate that can be mounted into a larger system. In one example, package substrate 610 is a system board, which can be a printed circuit board (PCB) such as a system on a chip (SOC) board. Solder 612 represents connections to mount to a system board such as a motherboard.

In one example, system 600 includes a stacked memory device, such as an HBM memory. The stacked memory device includes logic 640, which represents a base logic die for the memory stack. The memory stack includes N memory dies, represented as die 642[0], die 642[1], . . . , die 642[N−1], collectively dies 642. Dies 642 include bumps 644 on a bottom side of the memory die to interconnect to a top side of the memory die directly below it. Dies 642 include through silicon vias (TSVs) 646 through the dies to provide signaling through the dies. With bumps 644 and TSVs 646, the signals are connected through the stack between each die and logic 640.

In one example, in addition to bumps 644 and TSVs 646 for signal paths, the memory stack can include power paths through the devices. Bumps 632 represent power connections. TSVs 634 represent power TSVs through the memory dies. In one example, connections 622 include power connections as represented by the darker lines. Connections 622 represent the connections between logic 640 and substrate 610. Connections 624 represent signal connections through the die stack. The dark lines represent power connections through the die stack.

In one example, the number of power TSVs in system 600 is lower than a stack of standard memory dies. In one example, the pitch (e.g., spacing between power TSVs) provides increased density of power TSVs relative to a stack of standard memory dies. In one example, the physical interfaces (PHYs) can have power management circuitry, drivers, and timing circuitry that is different than a PHY of a standard device, due to the lower impedances and current control. In one example, the PHYs support different timing settings and higher signaling frequencies.

System 600 includes cooling system 650, which represents a cooling system that can cool system 600 to temperatures in a range of approximately −25 C to +25 C. The memory dies can be designed for operation at such low temperatures, in accordance with any example provided. System 600 does not explicitly show the pump and cooling unit for cooling system 650.

Figures 7, 8:
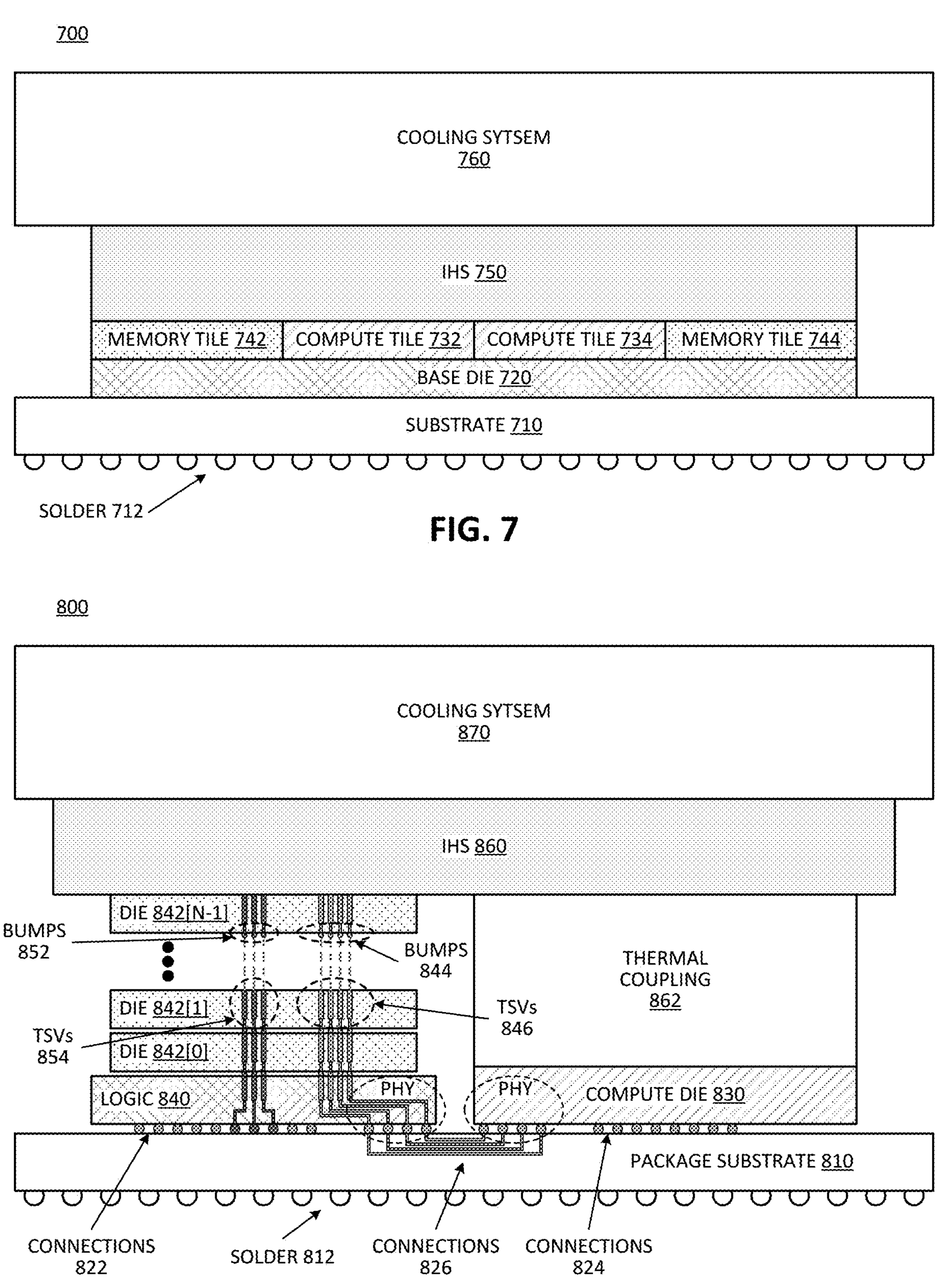
FIG. 7 is a block diagram of an example of a tile-based system with low temperature memory.
FIG. 8 is a block diagram of an example of a system with a stacked, low temperature memory.

FIG. 7 is a block diagram of an example of a tile-based system with low temperature memory. System 700 represents a system in accordance with an example of system 200 or an example of system 500, with transistors in accordance with an example of circuit 100 or an example of circuit 300.

System 700 represents a three-dimensional (3D) integrated system, with compute units and memory units together in a common package, such as an SOC. System 700 includes substrate 710 with solder 712. In one example, substrate 710 is a semiconductor substrate that can be mounted into a larger system. In one example, substrate 710 is a system board, which can be a printed circuit board (PCB) such as a system on a chip (SOC) board. Solder 712 represents connections to mount to a system board such as a motherboard.

Base die 720 represents a base substrate for a tile-based system. In a tile-based system, multiple dies are mounted together with die-on-die connections, without printed circuit boards to interconnect the dies. With die-on-die connections, the signal routing is on the dies themselves. In one example, base die 720 represents an interconnection die. In one example, base die 720 includes a tightly coupled cache device (TCCD). A TCCD can be a cache device shared among multiple compute dies, where the cache itself can be made of DRAM technology. Thus, in one example, base die 720 can include transistors designed for low temperature operation in accordance with any example provided.

In one example, system 700 includes multiple compute units implemented as compute tile 732 and compute tile 734, mounted on base die 720. The compute tiles can be central processing units, graphics processing units, accelerators, or other compute units. In one example, system 700 includes multiple memory devices, implemented as memory tile 742 and memory tile 744, also mounted on base die 720. Memory tile 742 and memory tile 744 can provide operational memory for the compute tiles, as a layer of memory above a cache device. Memory tile 742 and memory tile 744 can include transistors designed for low temperature operation in accordance with any example provided.

In one example, system 700 includes integrated heat spreader (IHS) 750 to spread heat from compute tile 732, compute tile 734, memory tile 742, and memory tile 744. IHS 750 can transfer heat from the memory and compute units to cooling system 760. Cooling system 760 represents a cooling system that can cool system 700 to temperatures in a range of approximately −25 C to +25 C. The compute tiles and memory tiles can be designed for operation at such low temperatures, in accordance with any example provided.

As discussed herein, system 700 can have device level improvements by designing the individual dies/tiles for operation in a low temperature environment, such as lower leakage current, lower power, or other improvements. Additionally, system 700 can have system level improvements due to the collective device level improvements, such as improved refresh performance and refresh management, signaling and timing improvements in memory access and communication, larger arrays, and other improvements.

FIG. 8 is a block diagram of an example of a system with a stacked, low temperature memory. System 800 represents a system in accordance with an example of system 200 or an example of system 600, with transistors in accordance with an example of circuit 100 or an example of circuit 300.

System 800 represents a three-dimensional (3D) integrated system, with compute units and memory units together in a common package, such as an SOC. System 800 includes package substrate 810 with solder 812. In one example, package substrate 810 is a semiconductor substrate that can be mounted into a larger system. In one example, package substrate 810 is a system board, which can be a printed circuit board (PCB) such as a system on a chip (SOC) board. Solder 812 represents connections to mount to a system board such as a motherboard.

In one example, system 800 includes an interposer, which represents an interconnection substrate to connect multiple dies to package substrate 810. In an example where the interposer is used, the interposer can be a semiconductor substrate to interconnect the multiple dies. In one example, the interposer can be a PCB to interconnect the multiple dies. In one example, the interposer can include routing to connect the dies to package substrate 810. In one example, the interposer can include routing to connect dies to each other.

In one example, system 800 includes a stacked memory device, such as an HBM memory. The stacked memory device includes logic 840, which represents a base logic die for the memory stack. The memory stack includes N memory dies, represented as die 842[0], die 842[1], . . . , die 842[N−1], collectively dies 842. Dies 842 include bumps 844 on a bottom side of the memory die to interconnect to a top side of the memory die directly below it. Dies 842 include through silicon vias (TSVs) 846 through the dies to provide signaling through the dies. With bumps 844 and TSVs 846, the signals are connected through the stack between each die and logic 840.

System 800 includes compute die 830, which represents a processor device. Compute die 830 can be a central processing unit, graphics processing unit, accelerator, or other compute unit. Compute die 830 can generate requests to access memory.

In an example where an interposer is used, the interposer can include connections 822 through the interposer to interconnect logic 840 and the memory stack to package substrate 810. In one example, connections 822 include signal paths straight through the interposer. In one example, the interposer routes signals laterally instead of routing straight through or in addition to routing straight through.

In one example, interposer includes connections 824 through the interposer to interconnect compute die 830 to package substrate 810. In one example, connections 824 include signal paths straight through the interposer. In one example, an interposer routes signals laterally instead of routing straight through or in addition to routing straight through.

In one example, an interposer includes connections 826 through the interposer to interconnect logic 840 to compute die 830. Logic 840 can have a physical interface (PHY), including drivers and logic circuitry to prepare outgoing signals for transmit and receive incoming signals. Compute die 830 includes a PHY to interface with the PHY of logic 840.

In one example, in addition to bumps 844 and TSVs 846 for signal paths, the memory stack can include power paths through the devices. Bumps 852 represent power connections. TSVs 854 represent power TSVs through the memory dies. In one example, connections 822 include power connections as represented by the darker lines.

In one example, the number of power TSVs in system 800 is lower than a stack of standard memory dies. In one example, the pitch (e.g., spacing between power TSVs) provides increased density of power TSVs relative to a stack of standard memory dies. In one example, the physical interfaces (PHYs) can have power management circuitry, drivers, and timing circuitry that is different than a PHY of a standard device, due to the lower impedances and current control. In one example, the PHYs support different timing settings and higher signaling frequencies.

In one example, system 800 includes integrated heat spreader (IHS) 860 to spread heat from compute die 830 and the memory stack of logic 840 and dies 842. In one example, compute die 830 has thermal coupling 862 as a gap filler between the top of the compute die to IHS 860 when the memory stack has a higher z-height than the compute die. IHS 860 can transfer heat from the memory and compute units to cooling system 870. Cooling system 870 represents a cooling system that can cool system 870 to temperatures in a range of approximately −25 C to +25 C. The compute die and memory can be designed for operation at such low temperatures, in accordance with any example provided.

As discussed herein, system 800 can have device level improvements by designing the individual dies for operation in a low temperature environment, such as lower leakage current, lower power, or other improvements. Additionally, system 800 can have system level improvements due to the collective device level improvements, such as improved refresh performance and refresh management, signaling and timing improvements in memory access and communication, and other improvements.

Figure 9:
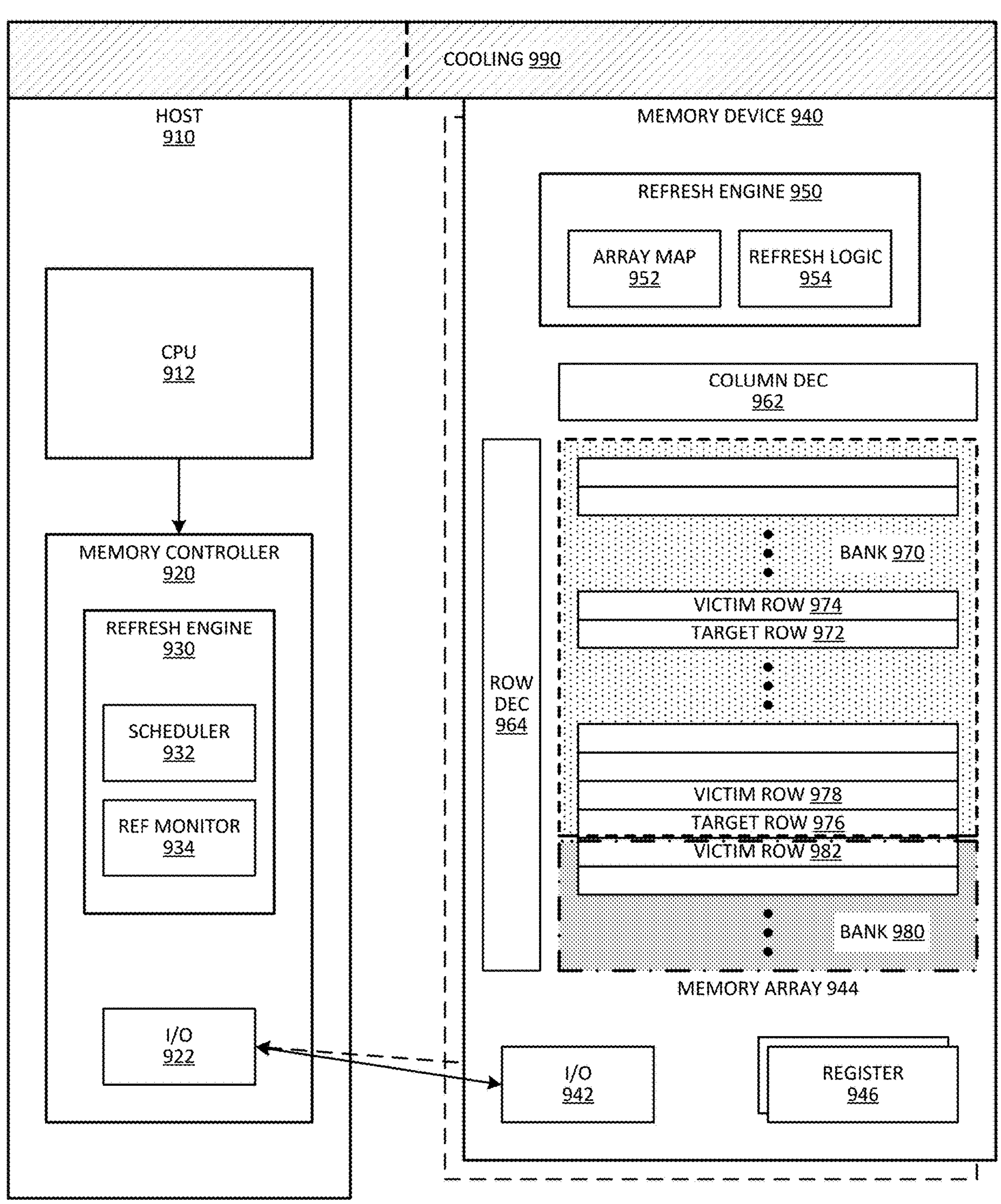
FIG. 9 is a block diagram of an example of a system that performs row hammer mitigation for a low temperature memory.

FIG. 9 is a block diagram of an example of a system that performs row hammer mitigation for a low temperature memory. System 900 represents a system in accordance with an example of system 200, with transistors in accordance with an example of circuit 100 or an example of circuit 300.

System 900 includes memory device 940 coupled to memory controller 920. Memory device 940 can include any type of memory technology that has adjacent rows of memory cells, where data is accessible via a wordline or the equivalent. In one example, memory device 940 includes DRAM technology. In one example, system 900 includes multiple memory devices 940.

Memory controller 920 is part of host 910, which represents a host system of which memory device 940 is part. Host 910 includes CPU 912, which represents one or more processors or processing resources for the host. CPU 912 generates memory access requests for memory device 940. Memory controller 920 can be an integrated memory controller (iMC), which is part of the CPU die, or a discrete component coupled to the CPU die. While shown as a CPU, alternatively, CPU 912 can be a graphics processing unit (GPU), an accelerator processor, or other processing component.

Memory device 940 includes memory array 944, which represents an array of memory cells. Memory array 944 includes a representation of potential row hammer conditions. For purposes of example, memory array 944 shows bank 970 and bank 980. It will be understood that memory array 944 can include multiple banks. In general, a bank or a sub-bank of memory includes memory cells that are addressable separately from memory cells of another bank or sub-bank.

Memory device 940 includes column decoder (DEC) 962 which represents circuitry to apply charge to a column (e.g., bias transistor access lines) based on an access command. In one example, the circuitry selects a column in response to a column address strobe (CAS) command. Memory device 940 includes row decoder (DEC) 964 which represents circuitry to apply selection voltages to rows (e.g., bias transistor access lines) based on a memory access command. In one example, the circuitry selects a column in response to a row address strobe (RAS) command.

For an illustration of a row hammer condition, memory array 944 includes target row 972 in bank 970. A physically proximate row or a physically adjacent row can suffer from unintentional programming or disturb of one or more values stored in the row based on repeated access to target row 972 within a time period prior to a refresh operation on the row. The repeated access results in charge migration based on ones in the target row adjacent zeros in the victim row.

Victim row 974 represents a row that is subject to row hammer when target row 972 is repeatedly accessed. When victim row 974 is at risk of a row hammer event, target row 972 can be referred to as an aggressor row. There may be another row in bank 970 that is a victim row to target row 972.

In one example, bank 970 also includes target row 976. Consider that target row 976 is at or near a bank boundary. It will be understood that the rows in memory array 944 may have a spacing that is not different even if the rows are in different banks or sub-banks. Rather, the separation of one bank or sub-bank to another can be defined by selection or decode hardware elements. Thus, depending on the architecture of the physical layout of the rows, a row on the boundary of bank 980 could also be at risk for a row hammer event based on access to target row 976. In one example, repeated access to a target row can cause a disturb of multiple adjacent rows. In as illustrated, target row 976 can result in row hammer events to both victim row 978 of bank 970 and victim row 982 of bank 980.

To avoid a row hammer condition due to access to target row 972, memory device 940 can perform refresh of the potential victim rows, such as victim row 974. Similarly, memory device 940 can perform refresh of victim row 978 and victim row 982 to avoid a row hammer condition due to repeated access to target row 976.

In one example, memory controller 920 includes refresh engine 930 to manage refresh of memory device 940. Refresh engine 930 can be executed at least partially as hardware logic within memory controller 920. In addition to hardware circuitry, refresh engine 930 can include firmware or software logic.

Refresh engine 930 can include scheduler 932, which represents logic in refresh engine 930 to schedule refresh commands to maintain cells of memory array 944 in a determinate state, such as by scheduling refresh of rows within a refresh window. In one example, refresh engine 930 includes refresh (REF) monitor 934. Refresh monitor 934 can enable memory controller 920 to monitor the need to refresh portions of memory array 944.

In one example, memory device 940 is a custom device designed to operate at low temperatures, in accordance with any example provided. Cooling 990 represents cooling for system 900, which can cool memory device 940 for low temperature operation. In one example, cooling 990 can cool memory device 940 and host 910. With device configuration for low temperature operation, the timing for refresh of memory array 944 can be different than a standard device. More particularly, due to lower leakages, the cells of memory device 940 do not need to be refreshed as often.

In one example, system 900 provides additional row hammer controls to refresh rows that are subject to a row hammer condition. In one example, the cells will be refreshed less frequently than a standard device, except for row hammer mitigation. The row hammer mitigation can include detection of which victim rows are subject to a row hammer condition and providing refreshes for those rows more frequently than the refresh schedule based on how long the cells can maintain state without refresh.

In one example, refresh monitor 934 can allows for more activates to occur before triggering a row hammer mitigation refresh. Row hammer causes unintentional cell programming due to the build up of charge on the gates of the transistors of the victim rows. With lower leakage, the build up of charge on the gates will be lower in system 900 as compared to a standard device. Thus, while system 900 can monitor for row hammer and trigger mitigation refreshes, the mitigation refreshes can be delayed for more target row accesses relative to a standard device.

I/O (input/output) 922 represents a hardware interface of memory controller 920 to connect to memory device 940. I/O 922 can include pins, pads, signal lines, drivers, receivers, or other hardware, or a combination of hardware components. I/O 922 can be controlled by control logic that configures and manages termination and driver components. I/O 942 represents I/O on memory device 940. Memory device 940 can interface with memory controller 920 via I/O 942 of memory device 940 and I/O 922 of memory controller 920. I/O 922 and I/O 942 provide interface hardware to couple to a data bus that interconnects memory controller 920 with memory device 940.

Memory device 940 includes register 946, which represents one or more registers or storage locations to store configuration information or values related to the operation of memory device 940. In one example, register 946 includes one or more mode registers. In one example, register 946 includes configuration information to control the operation memory device 940.

In one example, memory device 940 includes refresh engine 950, which can include hardware circuitry for refresh operations. Refresh engine 950 can include firmware or other software in addition to hardware logic for refresh. In one example, at least a portion of refresh engine 950 is implemented as part of an internal controller or control logic on memory device 940.

In one example, refresh engine 950 includes array map 952, which can represent a mapping of memory array 944. While memory controller 920 does not necessarily know what swizzling algorithm memory device 940 employs, array map 952 can allow refresh engine 950 to know adjacencies of rows for purposes of performing row hammer mitigation refresh operations. Refresh engine 950 can include refresh logic 954 to perform internal refresh operations, which can include row hammer mitigation refresh operations.

Figure 10:
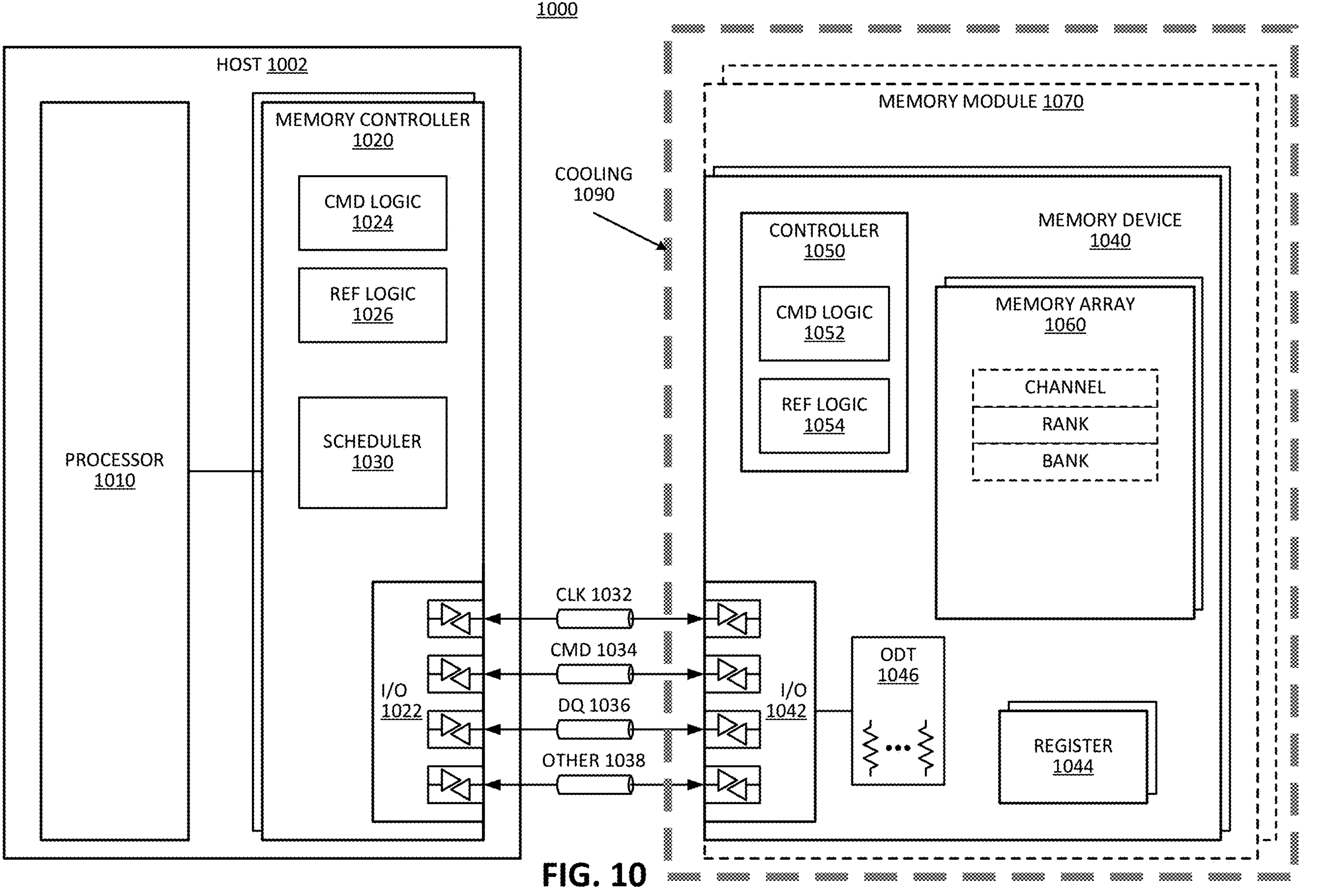
FIG. 10 is a block diagram of an example of a memory subsystem in which low temperature memory can be implemented.

FIG. 10 is a block diagram of an example of a memory subsystem in which low temperature memory can be implemented. System 1000 includes a processor and elements of a memory subsystem in a computing device. System 1000 represents a system with a memory subsystem in accordance with an example of system 200, an example of system 500, an example of system 600, an example of system 700, an example of system 800, or an example of system 900, with transistors in accordance with an example of circuit 100 or an example of circuit 300.

System 1000 can include cooling 1090 as a cooling system in accordance with any example provided. Cooling 1090 can cool the memory to a low operating temperature. In one example, cooling 1090 also cools host 1002. Memory module 1070 can represent on-package memory or a memory module with memory devices 1040 designed for low temperature operation in accordance with any example herein.

Host 1002 includes processor 1010, which represents a processing unit of a computing platform that may execute an operating system (OS) and applications, which can collectively be referred to as the host or the user of the memory. The OS and applications execute operations that result in memory accesses. Processor 1010 can include one or more separate processors. Each separate processor can include a single processing unit, a multicore processing unit, or a combination. The processing unit can be a primary processor such as a CPU (central processing unit), a peripheral processor such as a GPU (graphics processing unit), or a combination. Memory accesses may also be initiated by devices such as a network controller or hard disk controller. Such devices can be integrated with the processor in some systems or attached to the processor via a bus (e.g., PCI express), or a combination. System 1000 can be implemented as an SOC (system on a chip), or be implemented with standalone components.

Reference to memory devices can apply to different memory types. Memory devices often refers to volatile memory technologies. Volatile memory is memory whose state (and therefore the data stored on it) is indeterminate if power is interrupted to the device. Nonvolatile memory refers to memory whose state is determinate even if power is interrupted to the device. Dynamic volatile memory requires refreshing the data stored in the device to maintain state. One example of dynamic volatile memory includes DRAM (dynamic random-access memory), or some variant such as synchronous DRAM (SDRAM). A memory subsystem as described herein may be compatible with a number of memory technologies, such as DDR4 (double data rate version 4, JESD79-4, originally published in September 2012 by JEDEC (Joint Electron Device Engineering Council, now the JEDEC Solid State Technology Association), LPDDR4 (low power DDR version 4, JESD209-4, originally published by JEDEC in August 2014), WIO2 (Wide I/O 2 (WideIO2), JESD229-2, originally published by JEDEC in August 2014), HBM (high bandwidth memory DRAM, JESD235A, originally published by JEDEC in November 2015), DDR5 (DDR version 10, originally published by JEDEC in July 2020), LPDDR5 (LPDDR version 10, JESD209-5, originally published by JEDEC in February 2019), HBM2 (HBM version 2, JESD235C, originally published by JEDEC in January 2020), HBM3 (HBM version 3, JESD238, originally published by JEDEC in January 2022), or others or combinations of memory technologies, and technologies based on derivatives or extensions of such specifications.

Host 1002 includes memory controller 1020, which represents one or more memory controller circuits or devices for system 1000. In one example, memory controller 1020 is on the same semiconductor substrate as processor 1010. Memory controller 1020 represents control logic that generates memory access commands in response to the execution of operations by processor 1010. Memory controller 1020 accesses one or more memory devices 1040. Memory devices 1040 can be DRAM devices in accordance with any referred to above. In one example, memory devices 1040 are organized and managed as different channels, where each channel couples to buses and signal lines that couple to multiple memory devices in parallel. Each channel is independently operable. Thus, each channel is independently accessed and controlled, and the timing, data transfer, command and address exchanges, and other operations are separate for each channel. Coupling can refer to an electrical coupling, communicative coupling, physical coupling, or a combination of these. Physical coupling can include direct contact. Electrical coupling includes an interface or interconnection that allows electrical flow between components, or allows signaling between components, or both. Communicative coupling includes connections, including wired or wireless, that enable components to exchange data.

In one example, settings for each channel are controlled by separate mode registers or other register settings. In one example, each memory controller 1020 manages a separate memory channel, although system 1000 can be configured to have multiple channels managed by a single controller, or to have multiple controllers on a single channel. In one example, memory controller 1020 is part of host processor 1010, such as logic implemented on the same die or implemented in the same package space as the processor.

Memory controller 1020 includes I/O interface logic 1022 to couple to a memory bus, such as a memory channel as referred to above. I/O interface logic 1022 (as well as I/O interface logic 1042 of memory device 1040) can include pins, pads, connectors, signal lines, traces, or wires, or other hardware to connect the devices, or a combination of these. I/O interface logic 1022 can include a hardware interface. As illustrated, I/O interface logic 1022 includes at least drivers/transceivers for signal lines. Commonly, wires within an integrated circuit interface couple with a pad, pin, or connector to interface signal lines or traces or other wires between devices. I/O interface logic 1022 can include drivers, receivers, transceivers, or termination, or other circuitry or combinations of circuitry to exchange signals on the signal lines between the devices. The exchange of signals includes at least one of transmit or receive. While shown as coupling I/O 1022 from memory controller 1020 to I/O 1042 of memory device 1040, it will be understood that in an implementation of system 1000 where groups of memory devices 1040 are accessed in parallel, multiple memory devices can include I/O interfaces to the same interface of memory controller 1020. In an implementation of system 1000 including one or more memory modules 1070, I/O 1042 can include interface hardware of the memory module in addition to interface hardware on the memory device itself. Other memory controllers 1020 will include separate interfaces to other memory devices 1040.

The bus between memory controller 1020 and memory devices 1040 can be implemented as multiple signal lines coupling memory controller 1020 to memory devices 1040. The bus may typically include at least clock (CLK) 1032, command/address (CMD) 1034, data (DQ) 1036, and zero or more other signal lines 1038. In one example, a bus or connection between memory controller 1020 and memory can be referred to as a memory bus. In one example, the memory bus is a multi-drop bus. The signal lines for CMD can be referred to as a "C/A bus" (or ADD/CMD bus, or some other designation indicating the transfer of commands (C or CMD) and address (A or ADD) information) and the signal lines for write and read DQ can be referred to as a "data bus." In one example, independent channels have different clock signals, C/A buses, data buses, and other signal lines. Thus, system 1000 can be considered to have multiple "buses," in the sense that an independent interface path can be considered a separate bus. It will be understood that in addition to the lines explicitly shown, a bus can include at least one of strobe signaling lines, alert lines, auxiliary lines, or other signal lines, or a combination. It will also be understood that serial bus technologies can be used for the connection between memory controller 1020 and memory devices 1040. An example of a serial bus technology is 8B10B encoding and transmission of high-speed data with embedded clock over a single differential pair of signals in each direction. In one example, CMD 1034 represents signal lines shared in parallel with multiple memory devices. In one example, multiple memory devices share encoding command signal lines of CMD 1034, and each has a separate chip select (CS_n) signal line to select individual memory devices.

It will be understood that in the example of system 1000, the bus between memory controller 1020 and memory devices 1040 includes a subsidiary command bus CMD 1034 and a subsidiary bus to carry the write and read data, DQ 1036. In one example, the data bus can include bidirectional lines for read data and for write/command data. In another example, the subsidiary bus DQ 1036 can include unidirectional write signal lines for write and data from the host to memory, and can include unidirectional lines for read data from the memory to the host. In accordance with the chosen memory technology and system design, other signals 1038 may accompany a bus or sub bus, such as strobe lines DQS. Based on design of system 1000, or implementation if a design supports multiple implementations, the data bus can have more or less bandwidth per memory device 1040. For example, the data bus can support memory devices that have either a x4 interface, a x8 interface, a x16 interface, or other interface. The convention "xW," where W is an integer that refers to an interface size or width of the interface of memory device 1040, which represents a number of signal lines to exchange data with memory controller 1020. The interface size of the memory devices is a controlling factor on how many memory devices can be used concurrently per channel in system 1000 or coupled in parallel to the same signal lines. In one example, high bandwidth memory devices, wide interface devices, or stacked memory configurations, or combinations, can enable wider interfaces, such as a x128 interface, a x256 interface, a x512 interface, a x1024 interface, or other data bus interface width.

In one example, memory devices 1040 and memory controller 1020 exchange data over the data bus in a burst, or a sequence of consecutive data transfers. The burst corresponds to a number of transfer cycles, which is related to a bus frequency. In one example, the transfer cycle can be a whole clock cycle for transfers occurring on a same clock or strobe signal edge (e.g., on the rising edge). In one example, every clock cycle, referring to a cycle of the system clock, is separated into multiple unit intervals (UIs), where each UI is a transfer cycle. For example, double data rate transfers trigger on both edges of the clock signal (e.g., rising and falling). A burst can last for a configured number of UIs, which can be a configuration stored in a register, or triggered on the fly. For example, a sequence of eight consecutive transfer periods can be considered a burst length eight (BL8), and each memory device 1040 can transfer data on each UI. Thus, a x8 memory device operating on BL8 can transfer 64 bits of data (8 data signal lines times 8 data bits transferred per line over the burst). It will be understood that this simple example is merely an illustration and is not limiting.

Memory devices 1040 represent memory resources for system 1000. In one example, each memory device 1040 is a separate memory die. In one example, each memory device 1040 can interface with multiple (e.g., 2) channels per device or die. Each memory device 1040 includes I/O interface logic 1042, which has a bandwidth determined by the implementation of the device (e.g., x16 or x8 or some other interface bandwidth). I/O interface logic 1042 enables the memory devices to interface with memory controller 1020. I/O interface logic 1042 can include a hardware interface, and can be in accordance with I/O 1022 of memory controller, but at the memory device end. In one example, multiple memory devices 1040 are connected in parallel to the same command and data buses. In another example, multiple memory devices 1040 are connected in parallel to the same command bus, and are connected to different data buses. For example, system 1000 can be configured with multiple memory devices 1040 coupled in parallel, with each memory device responding to a command, and accessing memory resources 1060 internal to each. For a Write operation, an individual memory device 1040 can write a portion of the overall data word, and for a Read operation, an individual memory device 1040 can fetch a portion of the overall data word. The remaining bits of the word will be provided or received by other memory devices in parallel.

In one example, memory devices 1040 are disposed directly on a motherboard or host system platform (e.g., a PCB (printed circuit board) or substrate on which processor 1010 is disposed) of a computing device. In one example, memory devices 1040 can be organized into memory modules 1070. In one example, memory modules 1070 represent dual inline memory modules (DIMMs). In one example, memory modules 1070 represent other organization of multiple memory devices to share at least a portion of access or control circuitry, which can be a separate circuit, a separate device, or a separate board from the host system platform. Memory modules 1070 can include multiple memory devices 1040, and the memory modules can include support for multiple separate channels to the included memory devices disposed on them. In another example, memory devices 1040 may be incorporated into the same package as memory controller 1020, such as by techniques such as multi-chip-module (MCM), package-on-package, through-silicon via (TSV), or other techniques or combinations. Similarly, in one example, multiple memory devices 1040 may be incorporated into memory modules 1070, which themselves may be incorporated into the same package as memory controller 1020. It will be appreciated that for these and other implementations, memory controller 1020 may be part of host processor 1010.

Memory devices 1040 each include one or more memory arrays 1060. Memory array 1060 represents addressable memory locations or storage locations for data. Typically, memory array 1060 is managed as rows of data, accessed via wordline (rows) and bitline (individual bits within a row) control. Memory array 1060 can be organized as separate channels, ranks, and banks of memory. Channels may refer to independent control paths to storage locations within memory devices 1040. Ranks may refer to common locations across multiple memory devices (e.g., same row addresses within different devices) in parallel. Banks may refer to sub-arrays of memory locations within a memory device 1040. In one example, banks of memory are divided into sub-banks with at least a portion of shared circuitry (e.g., drivers, signal lines, control logic) for the sub-banks, allowing separate addressing and access. It will be understood that channels, ranks, banks, sub-banks, bank groups, or other organizations of the memory locations, and combinations of the organizations, can overlap in their application to physical resources. For example, the same physical memory locations can be accessed over a specific channel as a specific bank, which can also belong to a rank. Thus, the organization of memory resources will be understood in an inclusive, rather than exclusive, manner.

In one example, memory devices 1040 include one or more registers 1044. Register 1044 represents one or more storage devices or storage locations that provide configuration or settings for the operation of the memory device. In one example, register 1044 can provide a storage location for memory device 1040 to store data for access by memory controller 1020 as part of a control or management operation. In one example, register 1044 includes one or more Mode Registers. In one example, register 1044 includes one or more multipurpose registers. The configuration of locations within register 1044 can configure memory device 1040 to operate in different "modes," where command information can trigger different operations within memory device 1040 based on the mode. Additionally or in the alternative, different modes can also trigger different operation from address information or other signal lines depending on the mode. Settings of register 1044 can indicate configuration for I/O settings (e.g., timing, termination or ODT (on-die termination) 1046, driver configuration, or other I/O settings).

In one example, memory device 1040 includes ODT 1046 as part of the interface hardware associated with I/O 1042. ODT 1046 can be configured as mentioned above, and provide settings for impedance to be applied to the interface to specified signal lines. In one example, ODT 1046 is applied to DQ signal lines. In one example, ODT 1046 is applied to command signal lines. In one example, ODT 1046 is applied to address signal lines. In one example, ODT 1046 can be applied to any combination of the preceding. The ODT settings can be changed based on whether a memory device is a selected target of an access operation or a non-target device. ODT 1046 settings can affect the timing and reflections of signaling on the terminated lines. Careful control over ODT 1046 can enable higher-speed operation with improved matching of applied impedance and loading. ODT 1046 can be applied to specific signal lines of I/O interface 1042, 1022 (for example, ODT for DQ lines or ODT for CA lines), and is not necessarily applied to all signal lines.

Memory device 1040 includes controller 1050, which represents control logic within the memory device to control internal operations within the memory device. For example, controller 1050 decodes commands sent by memory controller 1020 and generates internal operations to execute or satisfy the commands. Controller 1050 can be referred to as an internal controller, and is separate from memory controller 1020 of the host. Controller 1050 can determine what mode is selected based on register 1044, and configure the internal execution of operations for access to memory resources 1060 or other operations based on the selected mode. Controller 1050 generates control signals to control the routing of bits within memory device 1040 to provide a proper interface for the selected mode and direct a command to the proper memory locations or addresses. Controller 1050 includes command logic 1052, which can decode command encoding received on command and address signal lines. Thus, command logic 1052 can be or include a command decoder. With command logic 1052, memory device can identify commands and generate internal operations to execute requested commands.

Referring again to memory controller 1020, memory controller 1020 includes command (CMD) logic 1024, which represents logic or circuitry to generate commands to send to memory devices 1040. The generation of the commands can refer to the command prior to scheduling, or the preparation of queued commands ready to be sent. Generally, the signaling in memory subsystems includes address information within or accompanying the command to indicate or select one or more memory locations where the memory devices should execute the command. In response to scheduling of transactions for memory device 1040, memory controller 1020 can issue commands via I/O 1022 to cause memory device 1040 to execute the commands. In one example, controller 1050 of memory device 1040 receives and decodes command and address information received via I/O 1042 from memory controller 1020. Based on the received command and address information, controller 1050 can control the timing of operations of the logic and circuitry within memory device 1040 to execute the commands. Controller 1050 is responsible for compliance with standards or specifications within memory device 1040, such as timing and signaling requirements. Memory controller 1020 can implement compliance with standards or specifications by access scheduling and control.

Memory controller 1020 includes scheduler 1030, which represents logic or circuitry to generate and order transactions to send to memory device 1040. From one perspective, the primary function of memory controller 1020 could be said to schedule memory access and other transactions to memory device 1040. Such scheduling can include generating the transactions themselves to implement the requests for data by processor 1010 and to maintain integrity of the data (e.g., such as with commands related to refresh). Transactions can include one or more commands, and result in the transfer of commands or data or both over one or multiple timing cycles such as clock cycles or unit intervals. Transactions can be for access such as read or write or related commands or a combination, and other transactions can include memory management commands for configuration, settings, data integrity, or other commands or a combination.

Memory controller 1020 typically includes logic such as scheduler 1030 to allow selection and ordering of transactions to improve performance of system 1000. Thus, memory controller 1020 can select which of the outstanding transactions should be sent to memory device 1040 in which order, which is typically achieved with logic much more complex that a simple first-in first-out algorithm. Memory controller 1020 manages the transmission of the transactions to memory device 1040, and manages the timing associated with the transaction. In one example, transactions have deterministic timing, which can be managed by memory controller 1020 and used in determining how to schedule the transactions with scheduler 1030.

In one example, memory controller 1020 includes refresh (REF) logic 1026. Refresh logic 1026 can be used for memory resources that are volatile and need to be refreshed to retain a deterministic state. In one example, refresh logic 1026 indicates a location for refresh, and a type of refresh to perform. Refresh logic 1026 can trigger self-refresh within memory device 1040, or execute external refreshes which can be referred to as auto refresh commands) by sending refresh commands, or a combination. In one example, controller 1050 within memory device 1040 includes refresh logic 1054 to apply refresh within memory device 1040. In one example, refresh logic 1054 generates internal operations to perform refresh in accordance with an external refresh received from memory controller 1020. Refresh logic 1054 can determine if a refresh is directed to memory device 1040, and what memory resources 1060 to refresh in response to the command.

Figure 11:
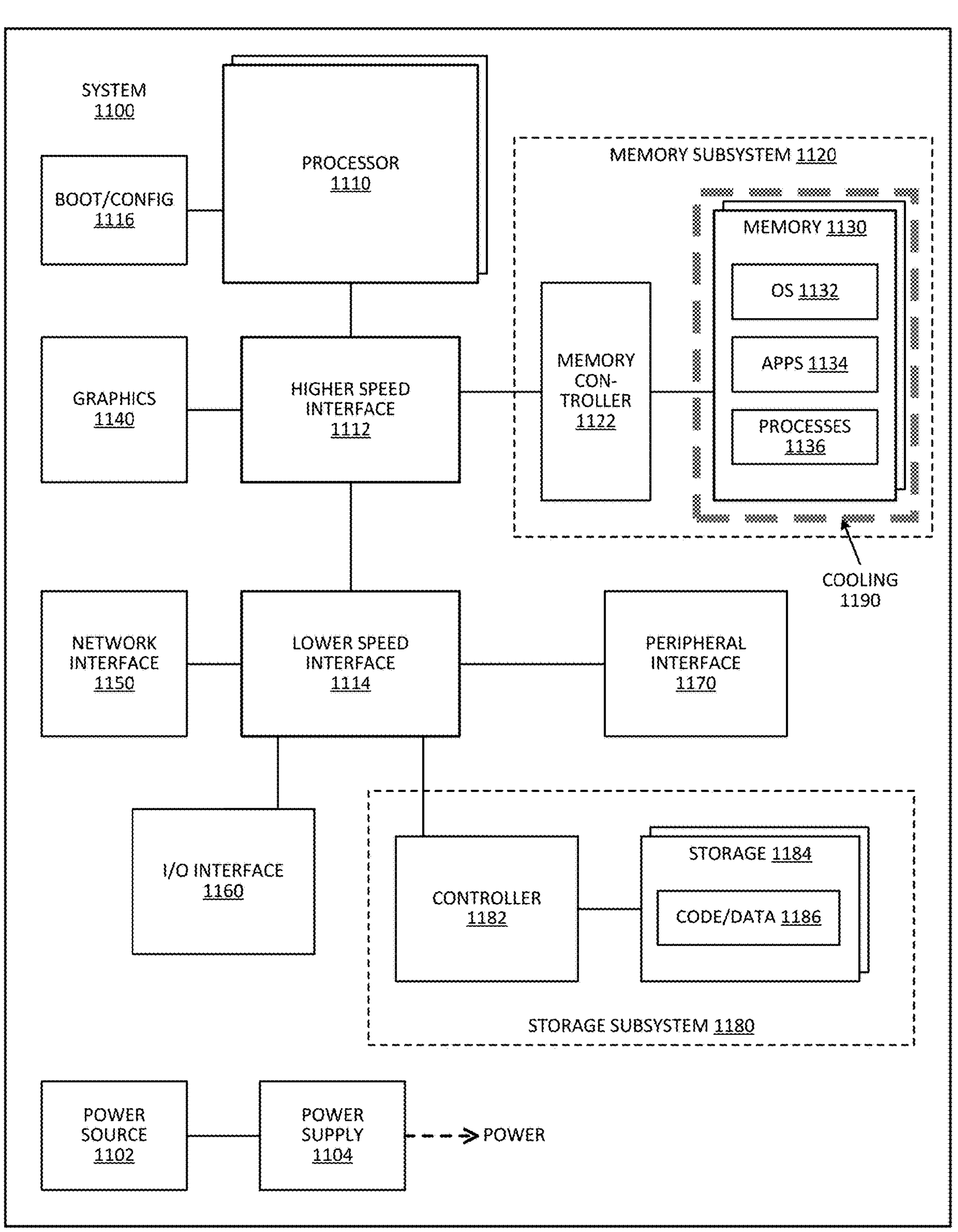
FIG. 11 is a block diagram of an example of a computing system in which low temperature memory can be implemented.

FIG. 11 is a block diagram of an example of a computing system in which low temperature memory can be implemented. System 1100 represents a computing device in accordance with any example herein, and can be a laptop computer, a desktop computer, a tablet computer, a server, a gaming or entertainment control system, embedded computing device, or other electronic device.

System 1100 represents a system with a memory subsystem in accordance with an example of system 200, an example of system 500, an example of system 600, an example of system 700, an example of system 800, or an example of system 900, with transistors in accordance with an example of circuit 100 or an example of circuit 300. System 1100 can include cooling 1190 as a cooling system in accordance with any example provided. Cooling 1190 can cool the memory to a low operating temperature. In one example, cooling 1190 also cools processor 1110. Memory subsystem 1120 can represent on-package memory or a memory module with memory 1130 designed for low temperature operation in accordance with any example herein.

System 1100 includes processor 1110 can include any type of microprocessor, central processing unit (CPU), graphics processing unit (GPU), processing core, or other processing hardware, processor device, or a combination, to provide processing or execution of instructions for system 1100. Processor 1110 controls the overall operation of system 1100, and can be or include, one or more programmable general-purpose or special-purpose microprocessors, digital signal processors (DSPs), programmable controllers, application specific integrated circuits (ASICs), programmable logic devices (PLDs), or a combination of such devices. Processor 1110 can be considered a host processor device for system 1100.

System 1100 includes boot/config 1116, which represents storage to store boot code (e.g., basic input/output system (BIOS)), configuration settings, security hardware (e.g., trusted platform module (TPM)), or other system level hardware that operates outside of a host OS. Boot/config 1116 can include a nonvolatile storage device, such as read-only memory (ROM), flash memory, or other memory devices.

In one example, system 1100 includes interface 1112 coupled to processor 1110, which can represent a higher speed interface or a high throughput interface for system components that need higher bandwidth connections, such as memory subsystem 1120 or graphics interface components 1140. Interface 1112 represents an interface circuit, which can be a standalone component or integrated onto a processor die. Interface 1112 can be integrated as a circuit onto the processor die or integrated as a component on a system on a chip. Where present, graphics interface 1140 interfaces to graphics components for providing a visual display to a user of system 1100. Graphics interface 1140 can be a standalone component or integrated onto the processor die or system on a chip. In one example, graphics interface 1140 can drive a high definition (HD) display or ultra high definition (UHD) display that provides an output to a user. In one example, the display can include a touchscreen display. In one example, graphics interface 1140 generates a display based on data stored in memory 1130 or based on operations executed by processor 1110 or both.

Memory subsystem 1120 represents the main memory of system 1100, and provides storage for code to be executed by processor 1110, or data values to be used in executing a routine. Memory subsystem 1120 can include one or more memory devices 1130 such as read-only memory (ROM), flash memory, one or more varieties of random access memory (RAM) such as DRAM, 3DXP (three-dimensional crosspoint), or other memory devices, or a combination of such devices. Memory 1130 stores and hosts, among other things, operating system (OS) 1132 to provide a software platform for execution of instructions in system 1100. Additionally, applications 1134 can execute on the software platform of OS 1132 from memory 1130. Applications 1134 represent programs that have their own operational logic to perform execution of one or more functions. Processes 1136 represent agents or routines that provide auxiliary functions to OS 1132 or one or more applications 1134 or a combination. OS 1132, applications 1134, and processes 1136 provide software logic to provide functions for system 1100. In one example, memory subsystem 1120 includes memory controller 1122, which is a memory controller to generate and issue commands to memory 1130. It will be understood that memory controller 1122 could be a physical part of processor 1110 or a physical part of interface 1112. For example, memory controller 1122 can be an integrated memory controller, integrated onto a circuit with processor 1110, such as integrated onto the processor die or a system on a chip.

While not specifically illustrated, it will be understood that system 1100 can include one or more buses or bus systems between devices, such as a memory bus, a graphics bus, interface buses, or others. Buses or other signal lines can communicatively or electrically couple components together, or both communicatively and electrically couple the components. Buses can include physical communication lines, point-to-point connections, bridges, adapters, controllers, or other circuitry or a combination. Buses can include, for example, one or more of a system bus, a Peripheral Component Interconnect (PCI) bus, a HyperTransport or industry standard architecture (ISA) bus, a small computer system interface (SCSI) bus, a universal serial bus (USB), or other bus, or a combination.

In one example, system 1100 includes interface 1114, which can be coupled to interface 1112. Interface 1114 can be a lower speed interface than interface 1112. In one example, interface 1114 represents an interface circuit, which can include standalone components and integrated circuitry. In one example, multiple user interface components or peripheral components, or both, couple to interface 1114. Network interface 1150 provides system 1100 the ability to communicate with remote devices (e.g., servers or other computing devices) over one or more networks. Network interface 1150 can include an Ethernet adapter, wireless interconnection components, cellular network interconnection components, USB (universal serial bus), or other wired or wireless standards-based or proprietary interfaces. Network interface 1150 can exchange data with a remote device, which can include sending data stored in memory or receiving data to be stored in memory.

In one example, system 1100 includes one or more input/output (I/O) interface(s) 1160. I/O interface 1160 can include one or more interface components through which a user interacts with system 1100 (e.g., audio, alphanumeric, tactile/touch, or other interfacing). Peripheral interface 1170 can include any hardware interface not specifically mentioned above. Peripherals refer generally to devices that connect dependently to system 1100. A dependent connection is one where system 1100 provides the software platform or hardware platform or both on which operation executes, and with which a user interacts.

In one example, system 1100 includes storage subsystem 1180 to store data in a nonvolatile manner. In one example, in certain system implementations, at least certain components of storage 1180 can overlap with components of memory subsystem 1120. Storage subsystem 1180 includes storage device(s) 1184, which can be or include any conventional medium for storing large amounts of data in a nonvolatile manner, such as one or more magnetic, solid state, 3DXP, or optical based disks, or a combination. Storage 1184 holds code or instructions and data 1186 in a persistent state (i.e., the value is retained despite interruption of power to system 1100). Storage 1184 can be generically considered to be a "memory," although memory 1130 is typically the executing or operating memory to provide instructions to processor 1110. Whereas storage 1184 is nonvolatile, memory 1130 can include volatile memory (i.e., the value or state of the data is indeterminate if power is interrupted to system 1100). In one example, storage subsystem 1180 includes controller 1182 to interface with storage 1184. In one example controller 1182 is a physical part of interface 1114 or processor 1110, or can include circuits or logic in both processor 1110 and interface 1114.

Power source 1102 provides power to the components of system 1100. More specifically, power source 1102 typically interfaces to one or multiple power supplies 1104 in system 1100 to provide power to the components of system 1100. In one example, power supply 1104 includes an AC to DC (alternating current to direct current) adapter to plug into a wall outlet. Such AC power can be renewable energy (e.g., solar power) power source 1102. In one example, power source 1102 includes a DC power source, such as an external AC to DC converter. In one example, power source 1102 or power supply 1104 includes wireless charging hardware to charge via proximity to a charging field. In one example, power source 1102 can include an internal battery or fuel cell source.

Figure 12:
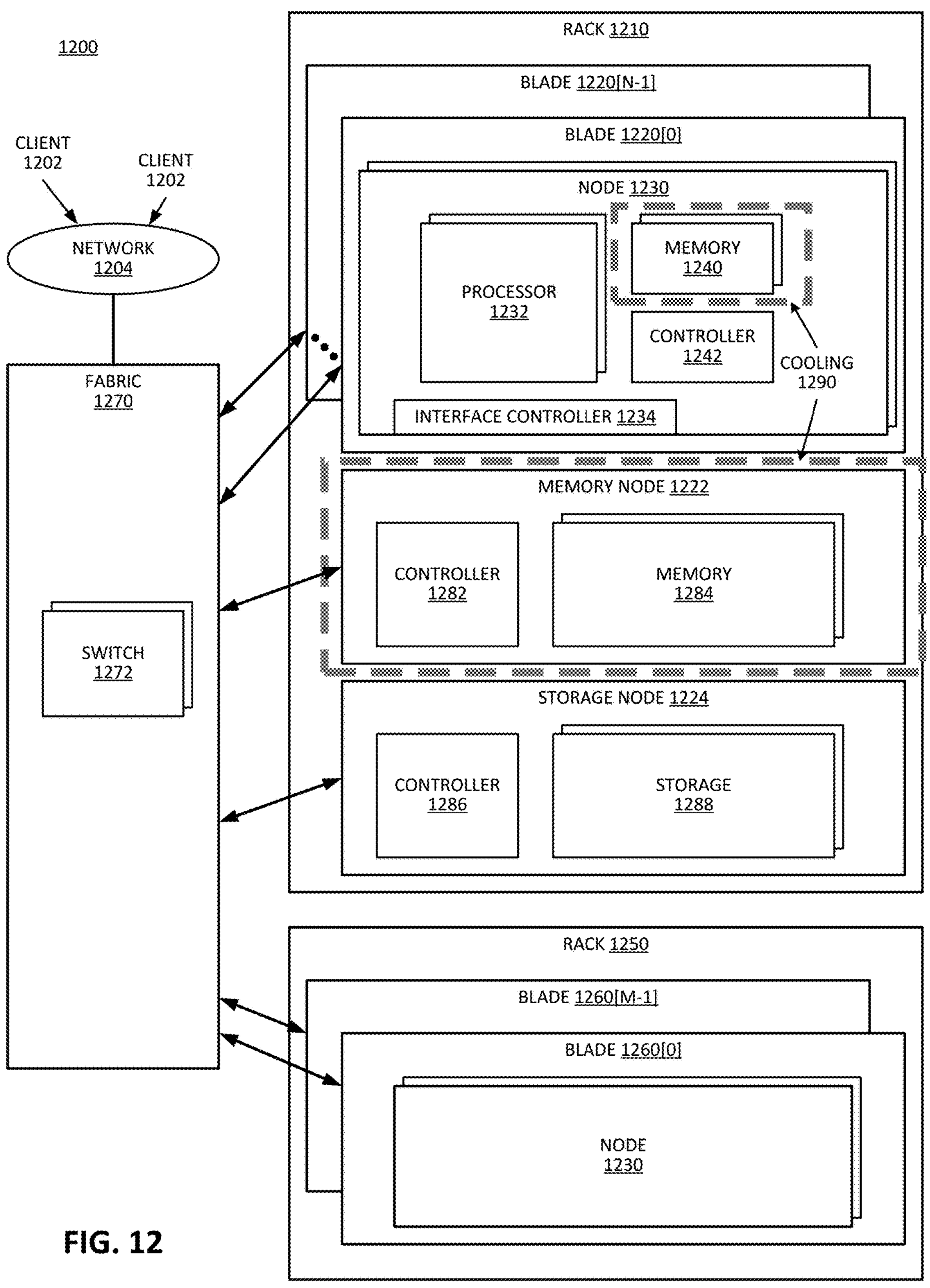
FIG. 12 is a block diagram of an example of a multi-node network in which low temperature memory can be implemented.

FIG. 12 is a block diagram of an example of a multi-node network in which low temperature memory can be implemented. System 1200 represents a network of nodes. In one example, system 1200 represents a data center. In one example, system 1200 represents a server farm. In one example, system 1200 represents a data cloud or a processing cloud.

System 1200 includes nodes 1230, which can represent a system with a memory subsystem in accordance with an example of system 200, an example of system 500, an example of system 600, an example of system 700, an example of system 800, or an example of system 900, with transistors in accordance with an example of circuit 100 or an example of circuit 300. System 1200 can include cooling 1290 as a cooling system in accordance with any example provided. Cooling 1290 can cool the memory to a low operating temperature. In one example, cooling 1290 cools memory 1240 of node 1230, referring to cooling the memory of a compute node. In one example, cooling 1290 also cools processor 1232 of node 1230. Memory 1240 can represent on-package memory or a memory module designed for low temperature operation in accordance with any example herein. In one example, memory node 1222 includes memory 1284 designed for low temperature operation. In one example, system 1200 includes cooling 1290 to cool memory node 1222 to a low operating temperature.

One or more clients 1202 make requests over network 1204 to system 1200. Network 1204 represents one or more local networks, or wide area networks, or a combination. Clients 1202 can be human or machine clients, which generate requests for the execution of operations by system 1200. System 1200 executes applications or data computation tasks requested by clients 1202.

In one example, system 1200 includes one or more racks, which represent structural and interconnect resources to house and interconnect multiple computation nodes. In one example, rack 1210 includes multiple nodes 1230. In one example, rack 1210 hosts multiple blade components, blade 1220[0], . . . , blade 1220[N−1], collectively blades 1220. Hosting refers to providing power, structural or mechanical support, and interconnection. Blades 1220 can refer to computing resources on printed circuit boards (PCBs), where a PCB houses the hardware components for one or more nodes 1230. In one example, blades 1220 do not include a chassis or housing or other "box" other than that provided by rack 1210. In one example, blades 1220 include housing with exposed connector to connect into rack 1210. In one example, system 1200 does not include rack 1210, and each blade 1220 includes a chassis or housing that can stack or otherwise reside in close proximity to other blades and allow interconnection of nodes 1230.

System 1200 includes fabric 1270, which represents one or more interconnectors for nodes 1230. In one example, fabric 1270 includes multiple switches 1272 or routers or other hardware to route signals among nodes 1230. Additionally, fabric 1270 can couple system 1200 to network 1204 for access by clients 1202. In addition to routing equipment, fabric 1270 can be considered to include the cables or ports or other hardware equipment to couple nodes 1230 together. In one example, fabric 1270 has one or more associated protocols to manage the routing of signals through system 1200. In one example, the protocol or protocols is at least partly dependent on the hardware equipment used in system 1200.

As illustrated, rack 1210 includes N blades 1220. In one example, in addition to rack 1210, system 1200 includes rack 1250. As illustrated, rack 1250 includes M blade components, blade 1260[0], . . . , blade 1260[M−1], collectively blades 1260. M is not necessarily the same as N; thus, it will be understood that various different hardware equipment components could be used, and coupled together into system 1200 over fabric 1270. Blades 1260 can be the same or similar to blades 1220. Nodes 1230 can be any type of node and are not necessarily all the same type of node. System 1200 is not limited to being homogenous, nor is it limited to not being homogenous.

The nodes in system 1200 can include compute nodes, memory nodes, storage nodes, accelerator nodes, or other nodes. Rack 1210 is represented with memory node 1222 and storage node 1224, which represent shared system memory resources, and shared persistent storage, respectively. One or more nodes of rack 1250 can be a memory node or a storage node.

Nodes 1230 represent examples of compute nodes. For simplicity, only the compute node in blade 1220[0] is illustrated in detail. However, other nodes in system 1200 can be the same or similar. At least some nodes 1230 are computation nodes, with processor (proc) 1232 and memory 1240. A computation node refers to a node with processing resources (e.g., one or more processors) that executes an operating system and can receive and process one or more tasks. In one example, at least some nodes 1230 are server nodes with a server as processing resources represented by processor 1232 and memory 1240.

Memory node 1222 represents an example of a memory node, with system memory external to the compute nodes. Memory nodes can include controller 1282, which represents a processor on the node to manage access to the memory. The memory nodes include memory 1284 as memory resources to be shared among multiple compute nodes.

Storage node 1224 represents an example of a storage server, which refers to a node with more storage resources than a computation node, and rather than having processors for the execution of tasks, a storage server includes processing resources to manage access to the storage nodes within the storage server. Storage nodes can include controller 1286 to manage access to the storage 1288 of the storage node.

In one example, node 1230 includes interface controller 1234, which represents logic to control access by node 1230 to fabric 1270. The logic can include hardware resources to interconnect to the physical interconnection hardware. The logic can include software or firmware logic to manage the interconnection. In one example, interface controller 1234 is or includes a host fabric interface, which can be a fabric interface in accordance with any example described herein. The interface controllers for memory node 1222 and storage node 1224 are not explicitly shown.

Processor 1232 can include one or more separate processors. Each separate processor can include a single processing unit, a multicore processing unit, or a combination. The processing unit can be a primary processor such as a CPU (central processing unit), a peripheral processor such as a GPU (graphics processing unit), or a combination. Memory 1240 can be or include memory devices represented by memory 1240 and a memory controller represented by controller 1242.

In accordance with the descriptions herein, a first memory device includes: a memory cell, including: a transistor with an operating temperature in a range of approximately −25 C to +25 C having a gate stack to adjust a work function to reduce a threshold voltage (Vth) by a range of 50-150 mV as compared to prior to adjustment of the work function; and a capacitor; and an access line to drive a bias voltage for the memory cell.

In accordance with an example of the first memory device, in one example, the transistor includes a high-K dielectric between metal of the gate stack and a transistor channel, the high-K dielectric controlled for thickness to adjust the work function to reduce the Vth by the range of 50-150 mV for the operating temperature in the range of approximately −25 C to +25 C. In accordance with any preceding example of the first memory device, in one example, the transistor includes an oxide between metal of the gate stack and a transistor channel, the oxide controlled for thickness to adjust the work function to reduce the Vth by the range of 50-150 mV for the operating temperature in the range of approximately −25 C to +25 C. In accordance with any preceding example of the first memory device, in one example, a metal gate thickness of the transistor is controlled for thickness to adjust the work function to reduce the Vth by the range of 50-150 mV for the operating temperature in the range of approximately −25 C to +25 C. In accordance with any preceding example of the first memory device, in one example, the gate stack has a metal gate composition controlled for composition to adjust the work function to reduce the Vth by the range of 50-150 mV for the operating temperature in the range of approximately −25 C to +25 C. In accordance with any preceding example of the first memory device, in one example, the memory cell comprises a single transistor, single capacitor dynamic random access memory (1T 1C DRAM) device. In accordance with any preceding example of the first memory device, in one example, the memory cell comprises one memory cell of an array of memory cells, wherein the access line comprises an array of wordlines and bitlines to control access to individual memory cells of the array. In accordance with any preceding example of the first memory device, in one example, the operating temperature comprises a subzero C temperature.

In accordance with the descriptions herein, a first system includes: a memory array including memory cells having: a transistor with an operating temperature in a range of approximately −25 C to +25 C having a gate stack to adjust a work function to reduce a threshold voltage (Vth) by a range of 50-150 mV as compared to prior to adjustment of the work function; and a capacitor; and an access line to drive a bias voltage for selected memory cells of the memory array; and a control circuit to selectively drive voltage on the access line.

In accordance with an example of the first system, in one example, to adjust the work function to reduce the Vth by the range of 50-150 mV for the operating temperature in the range of approximately −25 C to +25 C, the system has any of: the transistor includes a high-K dielectric between metal of the gate stack and a transistor channel, the high-K dielectric controlled for thickness; or the transistor includes an oxide between metal of the gate stack and a transistor channel, the oxide controlled for thickness; or a metal gate thickness of the transistor is controlled for thickness; or the gate stack has a metal gate composition controlled for composition to adjust the work function to reduce the Vth by the range of 50-150 mV for the operating temperature in the range of approximately −25 C to +25 C. In accordance with any preceding example of the first system, in one example, to adjust the work function to reduce the Vth by the range of 50-150 mV for the operating temperature in the range of approximately −25 C to +25 C, the system has any combination of: the transistor includes a high-K dielectric between metal of the gate stack and a transistor channel, the high-K dielectric controlled for thickness; the transistor includes an oxide between metal of the gate stack and a transistor channel, the oxide controlled for thickness; a metal gate thickness of the transistor is controlled for thickness; and the gate stack has a metal gate composition controlled for composition to adjust the work function to reduce the Vth by the range of 50-150 mV for the operating temperature in the range of approximately −25 C to +25 C. In accordance with any preceding example of the first system, in one example, the memory cells comprise single transistor, single capacitor dynamic random access memory (1T 1C DRAM) devices. In accordance with any preceding example of the first system, in one example, the memory cells comprise an array of memory cells, wherein the access line comprises an array of wordlines and bitlines to control access to individual memory cells of the array. In accordance with any preceding example of the first system, in one example, the operating temperature comprises a subzero C temperature. In accordance with any preceding example of the first system, in one example, the control circuit is to provide a bias voltage having a same value as a standard device having a Vth in a range of 300-500 mV, to provide a higher overdrive relative to the standard device. In accordance with any preceding example of the first system, in one example, the control circuit is to provide a bias voltage having a lower value as compared to a standard device having a Vth in a range of 300-500 mV, to provide a same overdrive as the standard device with lower power. In accordance with any preceding example of the first system, in one example, the memory array is part of a stacked memory device, with multiple memory dies coupled in a vertical stack. In accordance with any preceding example of the first system, in one example, the multiple memory dies are coupled with through silicon vias (TSVs), wherein the stacked memory device has 10-20% fewer TSVs as compared to a standard device having a Vth in a range of 300-500 mV.

In accordance with the descriptions herein, a second system includes: a memory array including memory cells having: a transistor with an operating temperature in a range of approximately −25 C to +25 C having a gate stack to adjust a work function to reduce a threshold voltage (Vth) by a range of 50-150 mV as compared to prior to adjustment of the work function; and a capacitor; and a processor device coupled to the memory array; and a cooling system to cool the memory array to the range of approximately −25 C to +25 C.

In accordance with an example of the second system, in one example, the system includes: a system on a chip (SOC) substrate, wherein the memory array is disposed on the SOC substrate and the processor device is disposed on the SOC substrate. In accordance with any preceding example of the second system, in one example, the cooling system is to cool the processor device to the range of approximately −25 C to +25 C. In accordance with any preceding example of the second system, in one example, to adjust the work function to reduce the Vth by the range of 50-150 mV for the operating temperature in the range of approximately −25 C to +25 C, the system has any of: the transistor includes a high-K dielectric between metal of the gate stack and a transistor channel, the high-K dielectric controlled for thickness; or the transistor includes an oxide between metal of the gate stack and a transistor channel, the oxide controlled for thickness; or a metal gate thickness of the transistor is controlled for thickness; or the gate stack has a metal gate composition controlled for composition to adjust the work function to reduce the Vth by the range of 50-150 mV for the operating temperature in the range of approximately −25 C to +25 C. In accordance with any preceding example of the second system, in one example, to adjust the work function to reduce the Vth by the range of 50-150 mV for the operating temperature in the range of approximately −25 C to +25 C, the system has any combination of: the transistor includes a high-K dielectric between metal of the gate stack and a transistor channel, the high-K dielectric controlled for thickness; the transistor includes an oxide between metal of the gate stack and a transistor channel, the oxide controlled for thickness; a metal gate thickness of the transistor is controlled for thickness; and the gate stack has a metal gate composition controlled for composition to adjust the work function to reduce the Vth by the range of 50-150 mV for the operating temperature in the range of approximately −25 C to +25 C. In accordance with any preceding example of the second system, in one example, the memory cells comprise single transistor, single capacitor dynamic random access memory (1T 1C DRAM) devices. In accordance with any preceding example of the second system, in one example, the memory cells comprise an array of memory cells, wherein the access line comprises an array of wordlines and bitlines to control access to individual memory cells of the array. In accordance with any preceding example of the second system, in one example, the operating temperature comprises a subzero C temperature. In accordance with any preceding example of the second system, in one example, the control circuit is to provide a bias voltage having a same value as a standard device having a Vth in a range of 300-500 mV, to provide a higher overdrive relative to the standard device. In accordance with any preceding example of the second system, in one example, the control circuit is to provide a bias voltage having a lower value as compared to a standard device having a Vth in a range of 300-500 mV, to provide a same overdrive as the standard device with lower power. In accordance with any preceding example of the second system, in one example, the memory array is part of a stacked memory device, with multiple memory dies coupled in a vertical stack. In accordance with any preceding example of the second system, in one example, the multiple memory dies are coupled with through silicon vias (TSVs), wherein the stacked memory device has 10-20% fewer TSVs as compared to a standard device having a Vth in a range of 300-500 mV.

In accordance with the descriptions herein, a second memory device includes: a memory cell, including: a transistor with an operating temperature in a range of approximately −25 C to +25 C having a gate stack to adjust a work function to reduce a threshold voltage (Vth) by a range of 50-150 mV as compared to a standard device having a Vth in a range of 300-500 mV; and a capacitor; and an access line to drive a bias voltage for the memory cell.

In accordance with an example of the second memory device, in one example, the transistor includes a high-K dielectric between metal of the gate stack and a transistor channel, the high-K dielectric controlled for thickness to adjust the work function to reduce the Vth by the range of 50-150 mV for the operating temperature in the range of approximately −25 C to +25 C. In accordance with any preceding example of the second memory device, in one example, the transistor includes an oxide between metal of the gate stack and a transistor channel, the oxide controlled for thickness to adjust the work function to reduce the Vth by the range of 50-150 mV for the operating temperature in the range of approximately −25 C to +25 C. In accordance with any preceding example of the second memory device, in one example, a metal gate thickness of the transistor is controlled for thickness to adjust the work function to reduce the Vth by the range of 50-150 mV for the operating temperature in the range of approximately −25 C to +25 C. In accordance with any preceding example of the second memory device, in one example, the gate stack has a metal gate composition controlled for composition to adjust the work function to reduce the Vth by the range of 50-150 mV for the operating temperature in the range of approximately −25 C to +25 C. In accordance with any preceding example of the second memory device, in one example, the memory cell comprises a single transistor, single capacitor dynamic random access memory (1T 1C DRAM) device. In accordance with any preceding example of the second memory device, in one example, the memory cell comprises one memory cell of an array of memory cells, wherein the access line comprises an array of wordlines and bitlines to control access to individual memory cells of the array. In accordance with any preceding example of the second memory device, in one example, the operating temperature comprises a subzero C temperature.

In accordance with the descriptions herein, a third system includes: a memory array including memory cells having: a transistor with an operating temperature in a range of approximately −25 C to +25 C having a gate stack to adjust a work function to reduce a threshold voltage (Vth) by a range of 50-150 mV as compared to a standard device having a Vth in a range of 300-500 mV; and a capacitor; and an access line to drive a bias voltage for selected memory cells of the memory array; and a control circuit to selectively drive voltage on the access line.

In accordance with an example of the third system, in one example, to adjust the work function to reduce the Vth by the range of 50-150 mV for the operating temperature in the range of approximately −25 C to +25 C, the system has any of: the transistor includes a high-K dielectric between metal of the gate stack and a transistor channel, the high-K dielectric controlled for thickness; or the transistor includes an oxide between metal of the gate stack and a transistor channel, the oxide controlled for thickness; or a metal gate thickness of the transistor is controlled for thickness; or the gate stack has a metal gate composition controlled for composition to adjust the work function to reduce the Vth by the range of 50-150 mV for the operating temperature in the range of approximately −25 C to +25 C. In accordance with any preceding example of the third system, in one example, to adjust the work function to reduce the Vth by the range of 50-150 mV for the operating temperature in the range of approximately −25 C to +25 C, the system has any combination of: the transistor includes a high-K dielectric between metal of the gate stack and a transistor channel, the high-K dielectric controlled for thickness; the transistor includes an oxide between metal of the gate stack and a transistor channel, the oxide controlled for thickness; a metal gate thickness of the transistor is controlled for thickness; and the gate stack has a metal gate composition controlled for composition to adjust the work function to reduce the Vth by the range of 50-150 mV for the operating temperature in the range of approximately −25 C to +25 C. In accordance with any preceding example of the third system, in one example, the memory cells comprise single transistor, single capacitor dynamic random access memory (1T 1C DRAM) devices. In accordance with any preceding example of the third system, in one example, the memory cells comprise an array of memory cells, wherein the access line comprises an array of wordlines and bitlines to control access to individual memory cells of the array. In accordance with any preceding example of the third system, in one example, the operating temperature comprises a subzero C temperature. In accordance with any preceding example of the third system, in one example, the control circuit is to provide a bias voltage having a same value as the standard device, to provide a higher overdrive relative to the standard device. In accordance with any preceding example of the third system, in one example, the control circuit is to provide a bias voltage having a lower value as compared to the standard device, to provide a same overdrive as the standard device with lower power. In accordance with any preceding example of the third system, in one example, the memory array is part of a stacked memory device, with multiple memory dies coupled in a vertical stack. In accordance with any preceding example of the third system, in one example, the multiple memory dies are coupled with through silicon vias (TSVs), wherein the stacked memory device has 10-20% fewer TSVs as compared to the standard device.

In accordance with the descriptions herein, fourth system includes: a memory array including memory cells having: a transistor with an operating temperature in a range of approximately −25 C to +25 C having a gate stack to adjust a work function to reduce a threshold voltage (Vth) by a range of 50-150 mV as compared to a standard device having a Vth in a range of 300-500 mV; and a capacitor; and a processor device coupled to the memory array; and a cooling system to cool the memory array to the range of approximately −25 C to +25 C.

In accordance with an example of the fourth system, in one example, the system includes: a system on a chip (SOC) substrate, wherein the memory array is disposed on the SOC substrate and the processor device is disposed on the SOC substrate. In accordance with any preceding example of the fourth system, in one example, the cooling system is to cool the processor device to the range of approximately −25 C to +25 C. In accordance with any preceding example of the fourth system, in one example, to adjust the work function to reduce the Vth by the range of 50-150 mV for the operating temperature in the range of approximately −25 C to +25 C, the system has any of: the transistor includes a high-K dielectric between metal of the gate stack and a transistor channel, the high-K dielectric controlled for thickness; or the transistor includes an oxide between metal of the gate stack and a transistor channel, the oxide controlled for thickness; or a metal gate thickness of the transistor is controlled for thickness; or the gate stack has a metal gate composition controlled for composition to adjust the work function to reduce the Vth by the range of 50-150 mV for the operating temperature in the range of approximately −25 C to +25 C. In accordance with any preceding example of the fourth system, in one example, to adjust the work function to reduce the Vth by the range of 50-150 mV for the operating temperature in the range of approximately −25 C to +25 C, the system has any combination of: the transistor includes a high-K dielectric between metal of the gate stack and a transistor channel, the high-K dielectric controlled for thickness; the transistor includes an oxide between metal of the gate stack and a transistor channel, the oxide controlled for thickness; a metal gate thickness of the transistor is controlled for thickness; and the gate stack has a metal gate composition controlled for composition to adjust the work function to reduce the Vth by the range of 50-150 mV for the operating temperature in the range of approximately −25 C to +25 C. In accordance with any preceding example of the fourth system, in one example, the memory cells comprise single transistor, single capacitor dynamic random access memory (1T 1C DRAM) devices. In accordance with any preceding example of the fourth system, in one example, the memory cells comprise an array of memory cells, wherein the access line comprises an array of wordlines and bitlines to control access to individual memory cells of the array. In accordance with any preceding example of the fourth system, in one example, the operating temperature comprises a subzero C temperature. In accordance with any preceding example of the fourth system, in one example, the control circuit is to provide a bias voltage having a same value as the standard device, to provide a higher overdrive relative to the standard device. In accordance with any preceding example of the fourth system, in one example, the control circuit is to provide a bias voltage having a lower value as compared to the standard device, to provide a same overdrive as the standard device with lower power. In accordance with any preceding example of the fourth system, in one example, the memory array is part of a stacked memory device, with multiple memory dies coupled in a vertical stack. In accordance with any preceding example of the fourth system, in one example, the multiple memory dies are coupled with through silicon vias (TSVs), wherein the stacked memory device has 10-20% fewer TSVs as compared to the standard device.

In accordance with the descriptions herein, a fifth system includes: a memory device with an array of memory cells having: a transistor with an operating temperature in a range of approximately −25 C to +25 C having a gate stack to adjust a work function to reduce a threshold voltage (Vth) by a range of 50-150 mV as compared to prior to adjustment of the work function; and a capacitor; and a memory controller coupled to the memory device, the memory controller to manage access to the memory device with adjusted control parameters based on lower leakage voltage for the memory cells and lower line resistance for the array at the operating temperature.

In accordance with an example of the fifth system, in one example, the adjusted control parameters comprise a longer time between refreshes as compared to a standard device having a Vt in a range of 300-500 mV. In accordance with any preceding example of the fifth system, in one example, the adjusted control parameters comprise a longer time between mitigation refreshes to address a row hammer condition. In accordance with any preceding example of the fifth system, in one example, the adjust control parameters comprises a lower operating voltage with a same signaling timing as compared to a standard device having a Vt in a range of 300-500 mV. In accordance with any preceding example of the fifth system, in one example, the adjust control parameters comprises a higher communication frequency at a same operating voltage as compared to a standard device having a Vt in a range of 300-500 mV. In accordance with any preceding example of the fifth system, in one example, the transistor includes a high-K dielectric between metal of the gate stack and a transistor channel, the high-K dielectric controlled for thickness to adjust the work function to reduce the Vth by the range of 50-150 mV for the operating temperature in the range of approximately −25 C to +25 C. In accordance with any preceding example of the fifth system, in one example, the transistor includes an oxide between metal of the gate stack and a transistor channel, the oxide controlled for thickness to adjust the work function to reduce the Vth by the range of 50-150 mV for the operating temperature in the range of approximately −25 C to +25 C. In accordance with any preceding example of the fifth system, in one example, a metal gate thickness of the transistor is controlled for thickness to adjust the work function to reduce the Vth by the range of 50-150 mV for the operating temperature in the range of approximately −25 C to +25 C. In accordance with any preceding example of the fifth system, in one example, the gate stack has a metal gate composition controlled for composition to adjust the work function to reduce the Vth by the range of 50-150 mV for the operating temperature in the range of approximately −25 C to +25 C. In accordance with any preceding example of the fifth system, in one example, the memory cells comprise single transistor, single capacitor dynamic random access memory (1T 1C DRAM) devices. In accordance with any preceding example of the fifth system, in one example, the memory cells comprise an array of memory cells, with an array of wordlines and bitlines to control access to individual memory cells of the array, wherein the array has a capacity approximately 10-20% larger as compared to a standard device having a Vt in a range of 300-500 mV, with a power draw approximately equal to the standard device. In accordance with any preceding example of the fifth system, in one example, the operating temperature comprises a subzero C temperature. In accordance with any preceding example of the fifth system, in one example, the system includes a control circuit to selectively drive voltage on a control line, wherein the control circuit is to provide a bias voltage having a same value as a standard device having a Vt in a range of 300-500 mV, to provide a higher overdrive relative to the standard device. In accordance with any preceding example of the fifth system, in one example, the system includes a control circuit to selectively drive voltage on a control line, wherein the control circuit is to provide a bias voltage having a lower value as compared to a standard device having a Vt in a range of 300-500 mV, to provide a same overdrive as the standard device with lower power. In accordance with any preceding example of the fifth system, in one example, the memory device comprises a stacked memory device, with multiple memory dies coupled in a vertical stack. In accordance with any preceding example of the fifth system, in one example, the multiple memory dies are coupled with through silicon vias (TSVs), wherein the stacked memory device has 10-20% fewer TSVs as compared to a standard device having a Vt in a range of 300-500 mV.

In accordance with the descriptions herein, a sixth system includes: a memory device with an array of memory cells having: a transistor with an operating temperature in a range of approximately −25 C to +25 C having a gate stack to adjust a work function to reduce a threshold voltage (Vth) by a range of 50-150 mV as compared to prior to adjustment of the work function; and a capacitor; a processor device coupled to the memory device, the processor device including a memory controller coupled to the memory device, the memory controller to manage access to the memory device with adjusted control parameters based on lower leakage voltage for the memory cells and lower line resistance for the array at the operating temperature; and a cooling system to cool the memory device to the range of approximately −25 C to +25 C.

In accordance with an example of the sixth system, in one example, the system includes: a system on a chip (SOC) substrate, wherein the memory device is disposed on the SOC substrate and the processor device is disposed on the SOC substrate. In accordance with any preceding example of the sixth system, in one example, the cooling system is to cool the processor device to the range of approximately −25 C to +25 C. In accordance with any preceding example of the sixth system, in one example, the memory device comprises a stacked memory device, with multiple memory dies coupled in a vertical stack.

In accordance with an example of the sixth system, in one example, the adjusted control parameters comprise a longer time between refreshes as compared to a standard device having a Vt in a range of 300-500 mV. In accordance with any preceding example of the sixth system, in one example, the adjusted control parameters comprise a longer time between mitigation refreshes to address a row hammer condition. In accordance with any preceding example of the sixth system, in one example, the adjust control parameters comprises a lower operating voltage with a same signaling timing as compared to a standard device having a Vt in a range of 300-500 mV. In accordance with any preceding example of the sixth system, in one example, the adjust control parameters comprises a higher communication frequency at a same operating voltage as compared to a standard device having a Vt in a range of 300-500 mV. In accordance with any preceding example of the sixth system, in one example, the transistor includes a high-K dielectric between metal of the gate stack and a transistor channel, the high-K dielectric controlled for thickness to adjust the work function to reduce the Vth by the range of 50-150 mV for the operating temperature in the range of approximately −25 C to +25 C. In accordance with any preceding example of the sixth system, in one example, the transistor includes an oxide between metal of the gate stack and a transistor channel, the oxide controlled for thickness to adjust the work function to reduce the Vth by the range of 50-150 mV for the operating temperature in the range of approximately −25 C to +25 C. In accordance with any preceding example of the sixth system, in one example, a metal gate thickness of the transistor is controlled for thickness to adjust the work function to reduce the Vth by the range of 50-150 mV for the operating temperature in the range of approximately −25 C to +25 C. In accordance with any preceding example of the sixth system, in one example, the gate stack has a metal gate composition controlled for composition to adjust the work function to reduce the Vth by the range of 50-150 mV for the operating temperature in the range of approximately −25 C to +25 C. In accordance with any preceding example of the sixth system, in one example, the memory cells comprise single transistor, single capacitor dynamic random access memory (1T 1C DRAM) devices. In accordance with any preceding example of the sixth system, in one example, the memory cells comprise an array of memory cells, with an array of wordlines and bitlines to control access to individual memory cells of the array, wherein the array has a capacity approximately 10-20% larger as compared to a standard device having a Vt in a range of 300-500 mV, with a power draw approximately equal to the standard device. In accordance with any preceding example of the sixth system, in one example, the operating temperature comprises a subzero C temperature. In accordance with any preceding example of the sixth system, in one example, the system includes a control circuit to selectively drive voltage on a control line, wherein the control circuit is to provide a bias voltage having a same value as a standard device having a Vt in a range of 300-500 mV, to provide a higher overdrive relative to the standard device. In accordance with any preceding example of the sixth system, in one example, the system includes a control circuit to selectively drive voltage on a control line, wherein the control circuit is to provide a bias voltage having a lower value as compared to a standard device having a Vt in a range of 300-500 mV, to provide a same overdrive as the standard device with lower power. In accordance with any preceding example of the sixth system, in one example, the memory device comprises a stacked memory device, with multiple memory dies coupled in a vertical stack. In accordance with any preceding example of the sixth system, in one example, the multiple memory dies are coupled with through silicon vias (TSVs), wherein the stacked memory device has 10-20% fewer TSVs as compared to a standard device having a Vt in a range of 300-500 mV.

In accordance with the descriptions herein, a seventh system includes: a memory device with an array of memory cells having: a transistor with an operating temperature in a range of approximately −25 C to +25 C having a gate stack to adjust a work function to reduce a threshold voltage (Vth) by a range of 50-150 mV as compared to a standard device having a Vt in a range of 300-500 mV; and a capacitor; and a memory controller coupled to the memory device, the memory controller to manage access to the memory device with adjusted control parameters based on lower leakage voltage for the memory cells and lower line resistance for the array as compared to the standard device.

In accordance with an example of the seventh system, in one example, the adjusted control parameters comprise a longer time between refreshes as compared to the standard device. In accordance with any preceding example of the seventh system, in one example, the adjusted control parameters comprise a longer time between mitigation refreshes to address a row hammer condition. In accordance with any preceding example of the seventh system, in one example, the adjust control parameters comprises a lower operating voltage with a same signaling timing as compared to the standard device. In accordance with any preceding example of the seventh system, in one example, the adjust control parameters comprises a higher communication frequency at a same operating voltage as compared to the standard device. In accordance with any preceding example of the seventh system, in one example, the transistor includes a high-K dielectric between metal of the gate stack and a transistor channel, the high-K dielectric controlled for thickness to adjust the work function to reduce the Vth by the range of 50-150 mV for the operating temperature in the range of approximately −25 C to +25 C. In accordance with any preceding example of the seventh system, in one example, the transistor includes an oxide between metal of the gate stack and a transistor channel, the oxide controlled for thickness to adjust the work function to reduce the Vth by the range of 50-150 mV for the operating temperature in the range of approximately −25 C to +25 C. In accordance with any preceding example of the seventh system, in one example, a metal gate thickness of the transistor is controlled for thickness to adjust the work function to reduce the Vth by the range of 50-150 mV for the operating temperature in the range of approximately −25 C to +25 C. In accordance with any preceding example of the seventh system, in one example, the gate stack has a metal gate composition controlled for composition to adjust the work function to reduce the Vth by the range of 50-150 mV for the operating temperature in the range of approximately −25 C to +25 C. In accordance with any preceding example of the seventh system, in one example, the memory cells comprise single transistor, single capacitor dynamic random access memory (1T 1C DRAM) devices. In accordance with any preceding example of the seventh system, in one example, the memory cells comprise an array of memory cells, with an array of wordlines and bitlines to control access to individual memory cells of the array, wherein the array has a capacity approximately 10-20% larger as compared to the standard device, with a power draw approximately equal to the standard device. In accordance with any preceding example of the seventh system, in one example, the operating temperature comprises a subzero C temperature. In accordance with any preceding example of the seventh system, in one example, the system includes a control circuit to selectively drive voltage on a control line, wherein the control circuit is to provide a bias voltage having a same value as the standard device, to provide a higher overdrive relative to the standard device. In accordance with any preceding example of the seventh system, in one example, the system includes a control circuit to selectively drive voltage on a control line, wherein the control circuit is to provide a bias voltage having a lower value as compared to the standard device, to provide a same overdrive as the standard device with lower power. In accordance with any preceding example of the seventh system, in one example, the memory device comprises a stacked memory device, with multiple memory dies coupled in a vertical stack. In accordance with any preceding example of the seventh system, in one example, the multiple memory dies are coupled with through silicon vias (TSVs), wherein the stacked memory device has 10-20% fewer TSVs as compared to the standard device.

In accordance with the descriptions herein, a eighth system includes: a memory device with an array of memory cells having: a transistor with an operating temperature in a range of approximately −25 C to +25 C having a gate stack to adjust a work function to reduce a threshold voltage (Vth) by a range of 50-150 mV as compared to a standard device having a Vth in a range of 300-500 mV; and a capacitor; a processor device coupled to the memory device, the processor device including a memory controller coupled to the memory device, the memory controller to manage access to the memory device with adjusted control parameters based on lower leakage voltage for the memory cells and lower line resistance for the array as compared to the standard device; and a cooling system to cool the memory device to the range of approximately −25 C to +25 C.

In accordance with an example of the eighth system, in one example, the system includes: a system on a chip (SOC) substrate, wherein the memory device is disposed on the SOC substrate and the processor device is disposed on the SOC substrate. In accordance with any preceding example of the eighth system, in one example, the cooling system is to cool the processor device to the range of approximately −25 C to +25 C. In accordance with any preceding example of the eighth system, in one example, the memory device comprises a stacked memory device, with multiple memory dies coupled in a vertical stack. In accordance with any preceding example of the eighth system, in one example, the adjusted control parameters comprise a longer time between refreshes as compared to the standard device. In accordance with any preceding example of the eighth system, in one example, the adjusted control parameters comprise a longer time between mitigation refreshes to address a row hammer condition. In accordance with any preceding example of the eighth system, in one example, the adjust control parameters comprises a lower operating voltage with a same signaling timing as compared to the standard device. In accordance with any preceding example of the eighth system, in one example, the adjust control parameters comprises a higher communication frequency at a same operating voltage as compared to the standard device. In accordance with any preceding example of the eighth system, in one example, the transistor includes a high-K dielectric between metal of the gate stack and a transistor channel, the high-K dielectric controlled for thickness to adjust the work function to reduce the Vth by the range of 50-150 mV for the operating temperature in the range of approximately −25 C to +25 C. In accordance with any preceding example of the eighth system, in one example, the transistor includes an oxide between metal of the gate stack and a transistor channel, the oxide controlled for thickness to adjust the work function to reduce the Vth by the range of 50-150 mV for the operating temperature in the range of approximately −25 C to +25 C. In accordance with any preceding example of the eighth system, in one example, a metal gate thickness of the transistor is controlled for thickness to adjust the work function to reduce the Vth by the range of 50-150 mV for the operating temperature in the range of approximately −25 C to +25 C. In accordance with any preceding example of the eighth system, in one example, the gate stack has a metal gate composition controlled for composition to adjust the work function to reduce the Vth by the range of 50-150 mV for the operating temperature in the range of approximately −25 C to +25 C. In accordance with any preceding example of the eighth system, in one example, the memory cells comprise single transistor, single capacitor dynamic random access memory (1T 1C DRAM) devices. In accordance with any preceding example of the eighth system, in one example, the memory cells comprise an array of memory cells, with an array of wordlines and bitlines to control access to individual memory cells of the array, wherein the array has a capacity approximately 10-20% larger as compared to the standard device, with a power draw approximately equal to the standard device. In accordance with any preceding example of the eighth system, in one example, the operating temperature comprises a subzero C temperature. In accordance with any preceding example of the eighth system, in one example, the system includes a control circuit to selectively drive voltage on a control line, wherein the control circuit is to provide a bias voltage having a same value as the standard device, to provide a higher overdrive relative to the standard device. In accordance with any preceding example of the eighth system, in one example, the system includes a control circuit to selectively drive voltage on a control line, wherein the control circuit is to provide a bias voltage having a lower value as compared to the standard device, to provide a same overdrive as the standard device with lower power. In accordance with any preceding example of the eighth system, in one example, the memory device comprises a stacked memory device, with multiple memory dies coupled in a vertical stack. In accordance with any preceding example of the eighth system, in one example, the multiple memory dies are coupled with through silicon vias (TSVs), wherein the stacked memory device has 10-20% fewer TSVs as compared to the standard device.

Flow diagrams as illustrated herein provide examples of sequences of various process actions. The flow diagrams can indicate operations to be executed by a software or firmware routine, as well as physical operations. A flow diagram can illustrate an example of the implementation of states of a finite state machine (FSM), which can be implemented in hardware and/or software. Although shown in a particular sequence or order, unless otherwise specified, the order of the actions can be modified. Thus, the illustrated diagrams should be understood only as examples, and the process can be performed in a different order, and some actions can be performed in parallel. Additionally, one or more actions can be omitted; thus, not all implementations will perform all actions.

To the extent various operations or functions are described herein, they can be described or defined as software code, instructions, configuration, and/or data. The content can be directly executable ("object" or "executable" form), source code, or difference code ("delta" or "patch" code). The software content of what is described herein can be provided via an article of manufacture with the content stored thereon, or via a method of operating a communication interface to send data via the communication interface. A machine readable storage medium can cause a machine to perform the functions or operations described, and includes any mechanism that stores information in a form accessible by a machine (e.g., computing device, electronic system, etc.), such as recordable/non-recordable media (e.g., read only memory (ROM), random access memory (RAM), magnetic disk storage media, optical storage media, flash memory devices, etc.). A communication interface includes any mechanism that interfaces to any of a hardwired, wireless, optical, etc., medium to communicate to another device, such as a memory bus interface, a processor bus interface, an Internet connection, a disk controller, etc. The communication interface can be configured by providing configuration parameters and/or sending signals to prepare the communication interface to provide a data signal describing the software content. The communication interface can be accessed via one or more commands or signals sent to the communication interface.

Various components described herein can be a means for performing the operations or functions described. Each component described herein includes software, hardware, or a combination of these. The components can be implemented as software modules, hardware modules, special-purpose hardware (e.g., application specific hardware, application specific integrated circuits (ASICs), digital signal processors (DSPs), etc.), embedded controllers, hardwired circuitry, etc.

Besides what is described herein, various modifications can be made to what is disclosed and implementations of the invention without departing from their scope. Therefore, the illustrations and examples herein should be construed in an illustrative, and not a restrictive sense. The scope of the invention should be measured solely by reference to the claims that follow.

What is claimed is:

1. A memory device comprising:

a memory cell, including:

a transistor with an operating temperature in a range of approximately −25 C to +25 C having a gate stack with a combination of metal and highly doped polysilicon that adjusts a work function of the gate stack to reduce a threshold voltage (Vth) from a range of approximately 300-500 mV by 100-150 mV, to result in a reduced leakage voltage for the memory cell as compared to the Vth of 300-500 mV; and a capacitor; and an access line to drive a bias voltage for the memory cell.

2. The memory device of claim 1, wherein the transistor includes a high-K dielectric between metal of the gate stack and a transistor channel, the high-K dielectric controlled for thickness to adjust the work function to reduce the Vth by 100-150 mV for the operating temperature in the range of approximately −25 C to +25 C.

3. The memory device of claim 1, wherein the transistor includes an oxide between metal of the gate stack and a transistor channel, the oxide controlled for thickness to adjust the work function to reduce the Vth by 100-150 mV for the operating temperature in the range of approximately −25 C to +25 C.

4. The memory device of claim 1, wherein a metal gate thickness of the transistor is controlled for thickness to adjust the work function to reduce the Vth by 100-150 mV for the operating temperature in the range of approximately −25 C to +25 C.

5. The memory device of claim 1, wherein the gate stack has a metal gate composition controlled for composition to adjust the work function to reduce the Vth by 100-150 mV for the operating temperature in the range of approximately −25 C to +25 C.

6. The memory device of claim 1, wherein the memory cell comprises a single transistor, single capacitor dynamic random access memory (1T 1C DRAM) device.

7. The memory device of claim 1, wherein the memory cell comprises one memory cell of an array of memory cells, wherein the access line comprises an array of wordlines and bitlines to control access to individual memory cells of the array.

8. The memory device of claim 1, wherein the operating temperature comprises a subzero C temperature.

9. A system comprising:

a memory array including memory cells having:

a transistor with an operating temperature in a range of approximately −25 C to +25 C having a gate stack with a combination of metal and highly doped polysilicon that adjusts a work function of the gate stack to reduce a threshold voltage (Vth) from a range of approximately 300-500 mV by 100-150 mV, to result in a reduced leakage voltage for the memory cell as compared to the Vth of 300-500 mV; and a capacitor; and an access line to drive a bias voltage for selected memory cells of the memory array; and a control circuit to selectively drive voltage on the access line.

10. The system of claim 9, wherein, to adjust the work function to reduce the Vth by 100-150 mV for the operating temperature in the range of approximately −25 C to +25 C, the system has any of:

the transistor includes a high-K dielectric between metal of the gate stack and a transistor channel, the high-K dielectric controlled for thickness; or the transistor includes an oxide between metal of the gate stack and a transistor channel, the oxide controlled for thickness; or a metal gate thickness of the transistor is controlled for thickness; or the gate stack has a metal gate composition controlled for composition to adjust the work function to reduce the Vth by 100-150 mV for the operating temperature in the range of approximately −25 C to +25 C.

11. The system of claim 9, wherein, to adjust the work function to reduce the Vth by 100-150 mV for the operating temperature in the range of approximately −25 C to +25 C, the system has any combination of:

the transistor includes a high-K dielectric between metal of the gate stack and a transistor channel, the high-K dielectric controlled for thickness;

the transistor includes an oxide between metal of the gate stack and a transistor channel, the oxide controlled for thickness;

a metal gate thickness of the transistor is controlled for thickness; and the gate stack has a metal gate composition controlled for composition to adjust the work function to reduce the Vth by 100-150 mV for the operating temperature in the range of approximately −25 C to +25 C.

12. The system of claim 9, wherein the memory cells comprise single transistor, single capacitor dynamic random access memory (1T 1C DRAM) devices.

13. The system of claim 9, wherein the memory cells comprise an array of memory cells, wherein the access line comprises an array of wordlines and bitlines to control access to individual memory cells of the array.

14. The system of claim 9, wherein the operating temperature comprises a subzero C temperature.

15. The system of claim 9, wherein the control circuit is to provide a bias voltage having a same value as the Vth of 300-500 mV, to provide a higher overdrive relative to the Vth of 300-500 mV.

16. The system of claim 9, wherein the control circuit is to provide a bias voltage having a lower value as the Vth of 300-500 mV, to provide a same overdrive as the Vth of 300-500 mV with lower power.

17. The system of claim 9, wherein the memory array is part of a stacked memory device, with multiple memory dies coupled in a vertical stack.

18. The system of claim 17, wherein the multiple memory dies are coupled with through silicon vias (TSVs), wherein the stacked memory device has 10-20% fewer TSVs as the Vth of 300-500 mV.

19. A system comprising:

a memory array including memory cells having:

a transistor with an operating temperature in a range of approximately −25 C to +25 C having a gate stack with a combination of metal and highly doped polysilicon that adjusts a work function of the gate stack to reduce a threshold voltage (Vth) from a range of approximately 300-500 mV by 100-150 mV, to result in a reduced leakage voltage for the memory cell as compared to the Vth of 300-500 mV; and a capacitor; and a processor device coupled to the memory array; and a cooling system to cool the memory array to the range of approximately −25 C to +25 C.

20. The system of claim 19, further comprising:

a system on a chip (SOC) substrate, wherein the memory array is disposed on the SOC substrate and the processor device is disposed on the SOC substrate.

21. The system of claim 19, wherein the cooling system is to cool the processor device to the range of approximately −25 C to +25 C.

* * * * *